(12) United States Patent
Tudman et al.

(10) Patent No.: US 12,419,022 B2
(45) Date of Patent: Sep. 16, 2025

(54) APPARATUS, SYSTEM, AND METHOD OF PROVIDING A CIRCUIT BOARD CARRIER FOR AN UNDERFILL SYSTEM

(71) Applicant: JABIL INC., St. Petersburg, FL (US)

(72) Inventors: Mark Tudman, St. Petersburg, FL (US); Rayce Loftin, St. Petersburg, FL (US)

(73) Assignee: JABIL INC.

( * ) Notice: Subject to any disclaimer, the term of this patent is extended or adjusted under 35 U.S.C. 154(b) by 1111 days.

(21) Appl. No.: 17/420,401

(22) PCT Filed: Dec. 19, 2019

(86) PCT No.: PCT/US2019/067307
§ 371 (c)(1),
(2) Date: Jul. 2, 2021

(87) PCT Pub. No.: WO2020/142225
PCT Pub. Date: Jul. 9, 2020

(65) Prior Publication Data
US 2022/0087082 A1    Mar. 17, 2022

Related U.S. Application Data

(60) Provisional application No. 62/788,519, filed on Jan. 4, 2019.

(51) Int. Cl.
*H05K 13/00* (2006.01)
*H01L 21/683* (2006.01)
*H05B 1/02* (2006.01)

(52) U.S. Cl.
CPC ....... *H05K 13/0069* (2013.01); *H01L 21/683* (2013.01); *H05B 1/023* (2013.01)

(58) Field of Classification Search
CPC .. H05K 13/0069; H01L 21/683; H05B 1/023; H05B 1/233
See application file for complete search history.

(56) References Cited

U.S. PATENT DOCUMENTS

| 4,080,730 A | 3/1978 | Woodman |
| 5,955,876 A | 9/1999 | Yamauchi |

(Continued)

FOREIGN PATENT DOCUMENTS

| CN | 1289146 | 3/2001 |
| CN | 101632163 | 1/2010 |
| CN | 104640641 | 5/2015 |

OTHER PUBLICATIONS

International Search Report and Written Opinion issued on Apr. 29, 2020 in PCT/US2019/067307.

(Continued)

*Primary Examiner* — C. A. Rivera
(74) *Attorney, Agent, or Firm* — Riverside Law LLP

(57) ABSTRACT

An apparatus, system and method for a carrier suitable to carry a circuit board through a semiconductor underfill process. The apparatus, system and method includes a modular carrier capable of supporting a printed circuit board during at least an underfill process, the modular carrier comprising: an outer frame having, at least about a center point thereof, at least one open aspect; and at least one frame inset suitable to be removably placed within the at least one open aspect, and capable of supporting at least a first type of the printed circuit board.

17 Claims, 23 Drawing Sheets

(56) References Cited

U.S. PATENT DOCUMENTS

| | | |
|---|---|---|
| 6,674,178 B1 | 1/2004 | Ikegami |
| 6,860,710 B1 | 3/2005 | Toshima |
| 8,146,902 B2 | 4/2012 | Cheng |
| 9,962,728 B2 | 5/2018 | Lu |
| 2003/0045028 A1 | 3/2003 | Tsao et al. |
| 2004/0023439 A1* | 2/2004 | Kimino ............... H01L 21/6715 |
| | | 438/126 |
| 2010/0326600 A1* | 12/2010 | Park ................. H01J 37/32724 |
| | | 156/345.37 |
| 2012/0168079 A1 | 7/2012 | Cheng et al. |
| 2014/0079871 A1 | 3/2014 | Lu |
| 2016/0262292 A1* | 9/2016 | Kuk .................... H05K 1/0218 |

OTHER PUBLICATIONS

Extended European Search Report issued in App. No. EP24153944, dated Apr. 16, 2024, 6 pages.

* cited by examiner

APPARATUS, SYSTEM, AND METHOD OF PROVIDING A CIRCUIT BOARD CARRIER FOR AN UNDERFILL SYSTEM

CROSS-REFERENCE TO RELATED APPLICATIONS

The present application claims benefit of priority to U.S. Provisional Application No. 62/788,519, filed Jan. 4, 2019, entitled: "Apparatus, System and Method of Providing a Circuit Board Carrier for an Underfill System," the entirety of which is incorporated herein by reference as if set forth in its entirety.

BACKGROUND

Field of the Disclosure

The disclosure relates generally to circuit board manufacturing, and, more particularly, to an apparatus, system, and method of providing a circuit board carrier for a semiconductor underfill system.

Background of the Disclosure

In a typical printed circuit board production process, numerous steps must be performed in order to complete the subject board. In short, these steps typically include the placement of solder on the board adjacent and along the existing printed circuit traces; the picking and placement of circuit components onto the solder, wherein such components may include, by way of example, resistors, capacitors, inductors, transistors, diodes, integrated circuit chips, and the like; reflow such that the placed board components are secured to and electrically associated with the printed circuit traces; and the underfill of the placed components to provide mechanical support to the components.

However, the underfill process suffers from enhanced difficulty for larger boards, and least because it becomes difficult to access the components on a large board to underfill those components, and further because, as underfill is the result, in most processes, of a capillary action by which the underfill flows under the component in the presence of heat. There are no known processes by which such heat can be consistently applied to large boards, particularly for large boards of odd shapes, prior to crosslinking by the underfill. Upon crosslinking by the underfill, the underfill will no longer move into the empty space beneath the components via the referenced capillary action.

SUMMARY OF THE DISCLOSURE

The disclosure is and includes at least an apparatus, system and method for a carrier suitable to carry a circuit board through a semiconductor underfill process. The apparatus, system and method includes a modular carrier capable of supporting a printed circuit board during at least an underfill process, the modular carrier comprising: an outer frame having, at least about a center point thereof, at least one open aspect; and at least one frame inset suitable to be removably placed within the at least one open aspect, and capable of supporting at least a first type of the printed circuit board.

BRIEF DESCRIPTION OF THE DRAWINGS

The disclosure is illustrated by way of example and not limitation in the accompanying drawings, in which like references may indicate similar elements, and in which.

DETAILED DESCRIPTION

Figure 1:
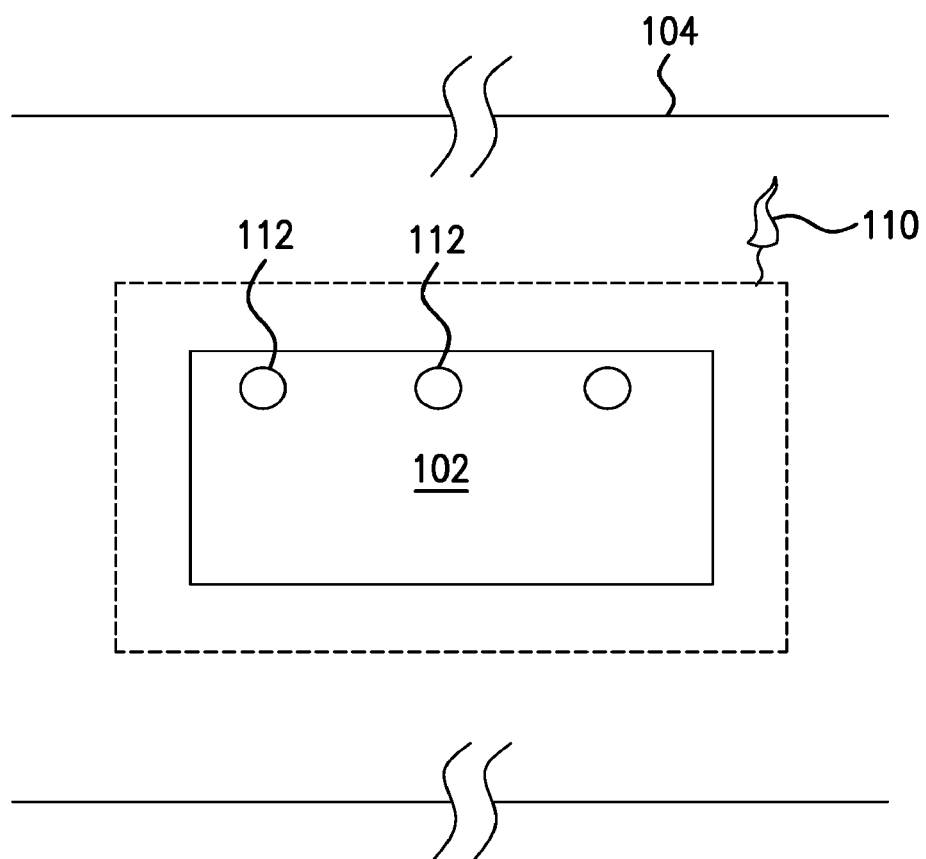
FIG. 1 illustrates a circuit board component.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second," and other numerical terms, when used herein, do not imply a sequence or order unless clearly indicated by the context. Thus, a first element, component, region, layer or section discussed below could be termed a second element, component, region, layer or section without departing from the teachings of the exemplary embodiments.

Processor-implemented modules, systems and methods of use are disclosed herein that may provide access to and transformation of a plurality of types of digital content, including but not limited to video, image, text, audio, metadata, algorithms, interactive and document content, and which track, deliver, manipulate, transform and report the accessed content. Described embodiments of these modules, systems and methods are intended to be exemplary and not limiting. As such, it is contemplated that the herein described systems and methods may be adapted and may be extended to provide enhancements and/or additions to the exemplary modules, systems and methods described. The disclosure is thus intended to include all such extensions.

FIG. 1 illustrates the top view of a component 102 placed onto a printed circuit board 104. The component has, under-filled beneath the component and at least partially extending outside the outermost perimeter 106 of the component from a top view, an under-fill 110. The under-fill 110 is generally placed, in part, because solder joints 112 formed by the reflowed solder to hold the component 102 to the board 104 do not provide sufficient mechanical strength to hold the component 102 sturdily and operably in place on the board 104. The under-fill 110 beneath the component 102 and adjacent to the solder joints 112 provides this mechanical stability.

Figure 2:
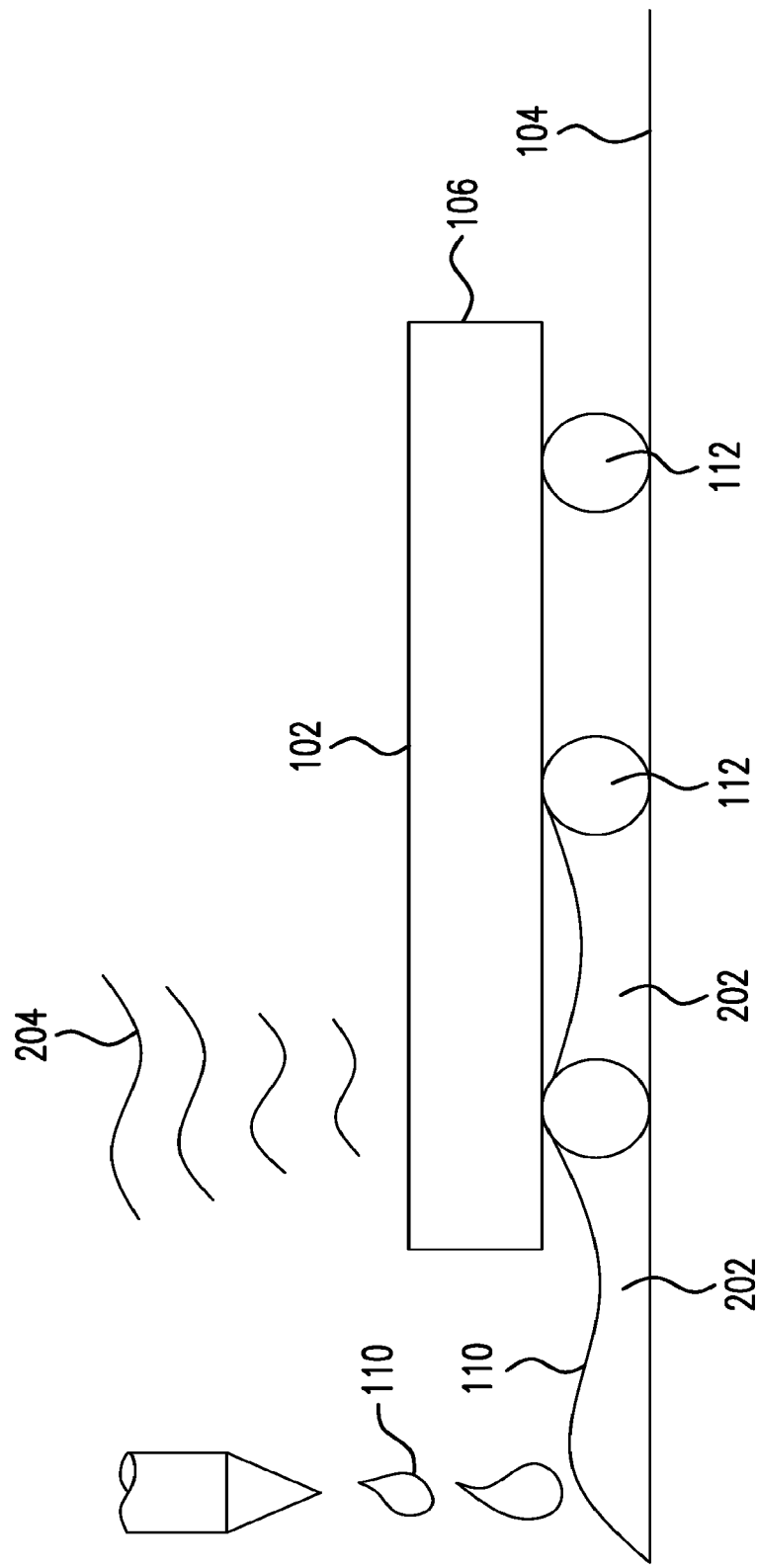
FIG. 2 illustrates capillary action for an underfilled component.

FIG. 2 illustrates a capillary action 202 of an under-fill 110 such that the underfill 110 flows to support a board component 102. In the illustration, about the perimeter 106 of the component 102 and adjacent to the reflow solder joints 112, the under-fill 110 fills in by capillary action 202. Application of heat 204 causes this creeping flow of the under-fill 110 by the capillary action 202 in the example shown. This creeping flow fills underneath the component 102 and into the gaps beneath and around the component 102, between the component 102 and the board 104 on which it resides, and around the connectors by which the component 102 communicates with the board's traces through the solder joints 112. Of note, it is typical that several applications of the under-fill 110 may be needed in order to sufficiently fill the under-component gaps such that the requisite mechanical stability is provided to the component 102 in its location on the subject board 104.

The various aforementioned aspects of under-fill 110, namely, the providing of under-fill material upon the application of heat 204 that enables the capillary action 202 of the underfill 110, are particularly difficult for larger size boards, as referenced above. This is, in part, because prior art under-fill machines have needed to be significantly bigger than the board placed therein, in order to allow for the referenced electromechanical components of the underfill machine to perform the various under-fill and heating functions described herein. Therefore, the larger board, the more the aforementioned issues of providing heat and underfill are exacerbated.

Thus, the embodiments provide an apparatus, system, and method for an under-fill machine that accommodates circular boards of up to 48 inches or more in diameter to provide underfill to the components thereon. Accordingly, accommodated boards in the embodiments may also be smaller than 48 inches, such as 34 inches, 38 inches, or 42 inches, and the disclosed teachings may also be applied to boards larger than 48 inches, such as 52 inches, 54 inches, or 56 inches, by way of nonlimiting example.

Figure 3:
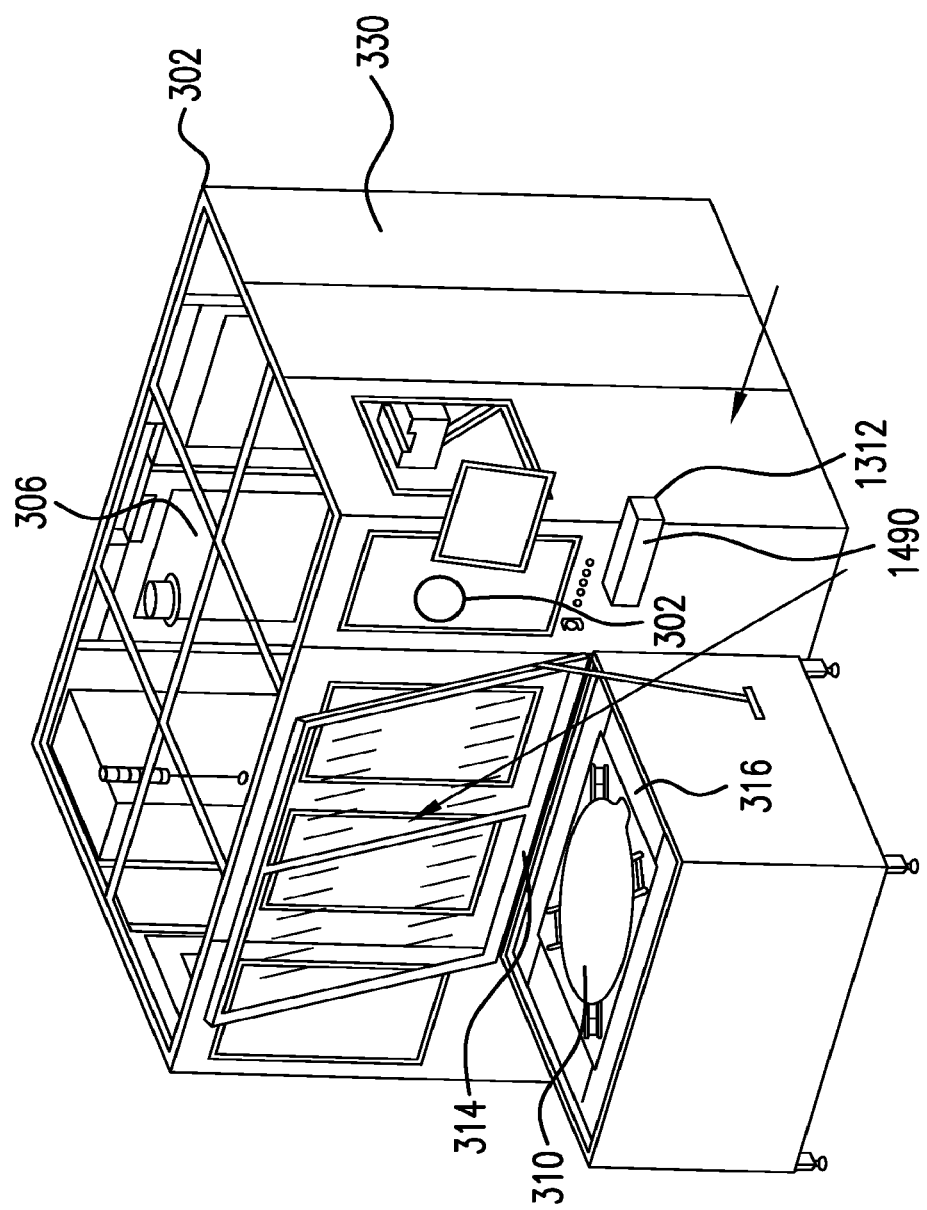
FIG. 3 illustrates and underfill machine.

FIG. 3 illustrates an under-fill machine 302. In the illustration, electromechanical/robotic elements 304 for the providing of at least underfill may be present within an underfill chamber 306, such as two such robots to the right and left sides of the front aspect of the machine 302. These robots 304 may be controlled by software 1490 executed by at least one processing system 1312, and this software 1490 may comprise algorithms that allow for training of the robots 304 to provide underfill in various contexts and to various components; that allow for the providing of this underfill; and for collision avoidance, such as in embodiments wherein the board 310 is sufficiently large so as to require the use of multiple robots 304 to provide underfill in multiple areas of the board 310 simultaneously, so that the robots 304 do not collide when transmitting their respective algorithmic paths.

Also included, such as at the front aspect of the machine 302, may be an accommodating input 314 of suitable size to allow for insertion into the machine 302 of a printed circuit board 310, such as the larger boards discussed throughout. Of note, the accommodating input 314 may allow for placement of the subject board 310 onto a carrier 316 prior to and/or upon insertion to the input 314, such that a printed circuit board 310 may or may not reside on the carrier 316 prior to and/or throughout the under-fill process, as discussed further herein. Additionally, the accommodating input 314 may receive the board 310 and/or the carrier 316 on which the board 310 resides via any known methodologies, such as manually or automatically, such as indexed or unindexed, and/or through the use of an input slide, shuttle or an input conveyor, by way of nonlimiting example.

Figure 4:
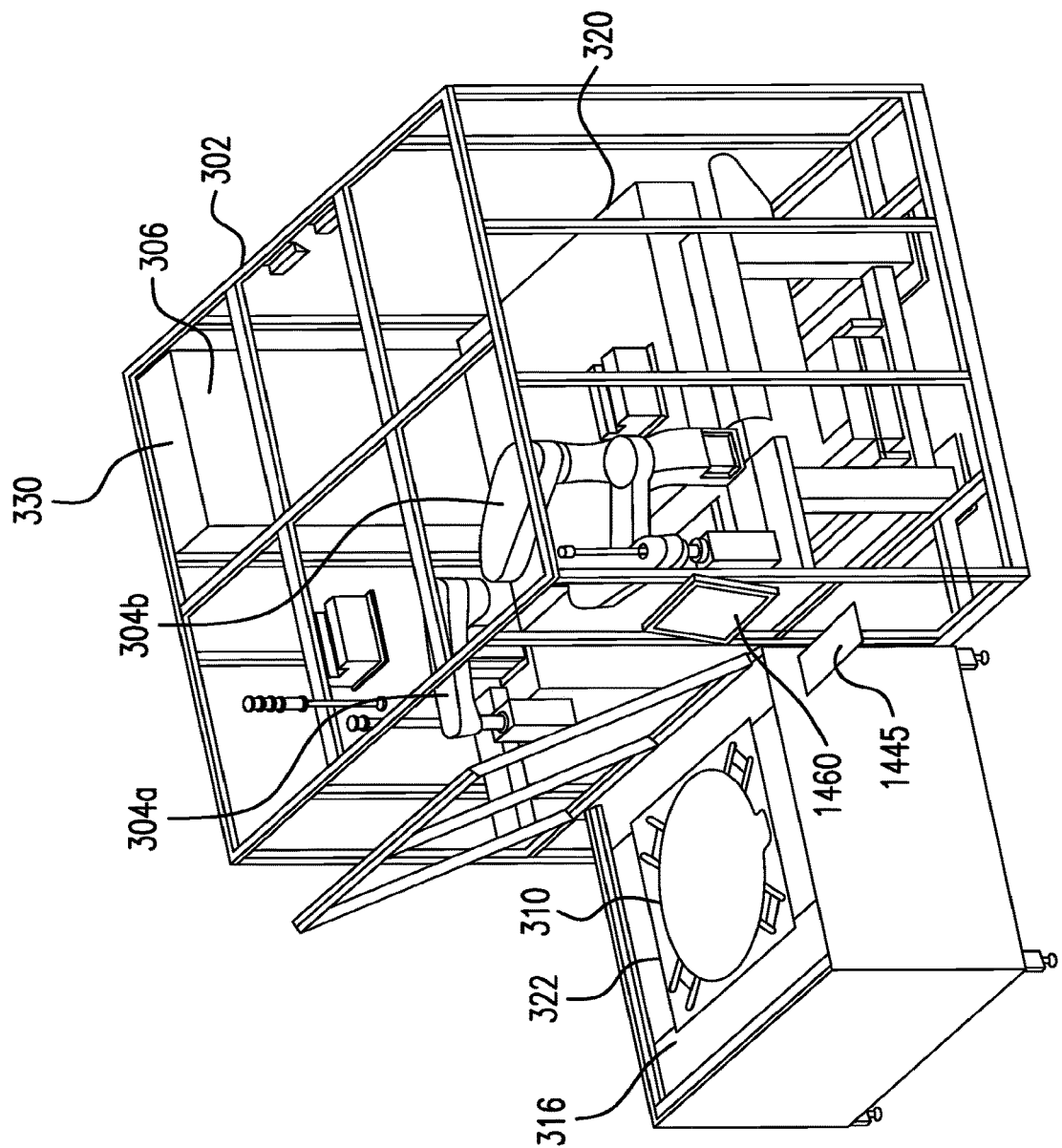
FIG. 4 illustrates and underfill machine.

Now also with respect to FIGS. 3 and 4, the chamber 306 of the under-fill machine 302 may include, proximate to the robots 304 and by way of nonlimiting example, an overhead heat source 320 and a lower heat source 322. The lower heat source 322 may include, by way of nonlimiting example, heating one or more aspects of the board 310, or the entirety of the board 310, from the underside of the board 310, such as by heating, or providing heat from, the carrier 316 with which the board 310 is associated. This lower heat may be provided to the board 310 and/or to or from the carrier 316 via any known methodology, such as forced air heating, IR heating, or RF/inductive heating, by way of non-limiting example. It may be desirable in some embodiments that the lower heat provided be at least substantially uniform over that portion of the board 310 to which the heat is provided.

The overhead heater 320 may be in the style of an oven, such as wherein the provided overhead translates through a medium, such as air or other gas, to the topmost portion of any aspect of the board 310 that is adjacent the overhead heater 320. As such, the provided overhead heat may be of any known type, such as forced air heat, RF/inductively generated heat, and so on. Of note, in embodiments, the overhead heater 320 may only be of sufficient size to accommodate approximately half the circuit board 310 thereunder, such that the circuit board 310, whether or not associated with the carrier 316, may be rotated to place aspects previously unheated underneath the overhead heater 320, such as one portion of the board 310 at a time. This rotation to be subjected to the overhead heater 320 may be performed manually or automatically, as discussed throughout, and is referenced herein throughout as underfill heat indexing.

The foregoing indexing and heating may be subjected to control by the aforementioned processing system 1312. As evident from FIGS. 3, 4, and 5, operator display and control 1445, 1460 may be safely located outside of the under-fill machine 302, such as at the front portion thereof, and in communication with the processing system 1312. Further, an input/output "cabinet" 330 may be provided for user access safely at the rear of the machine 302 as shown, such as to the processing system 1312 and/or electromechanical aspects of the machine 302.

Figure 5:
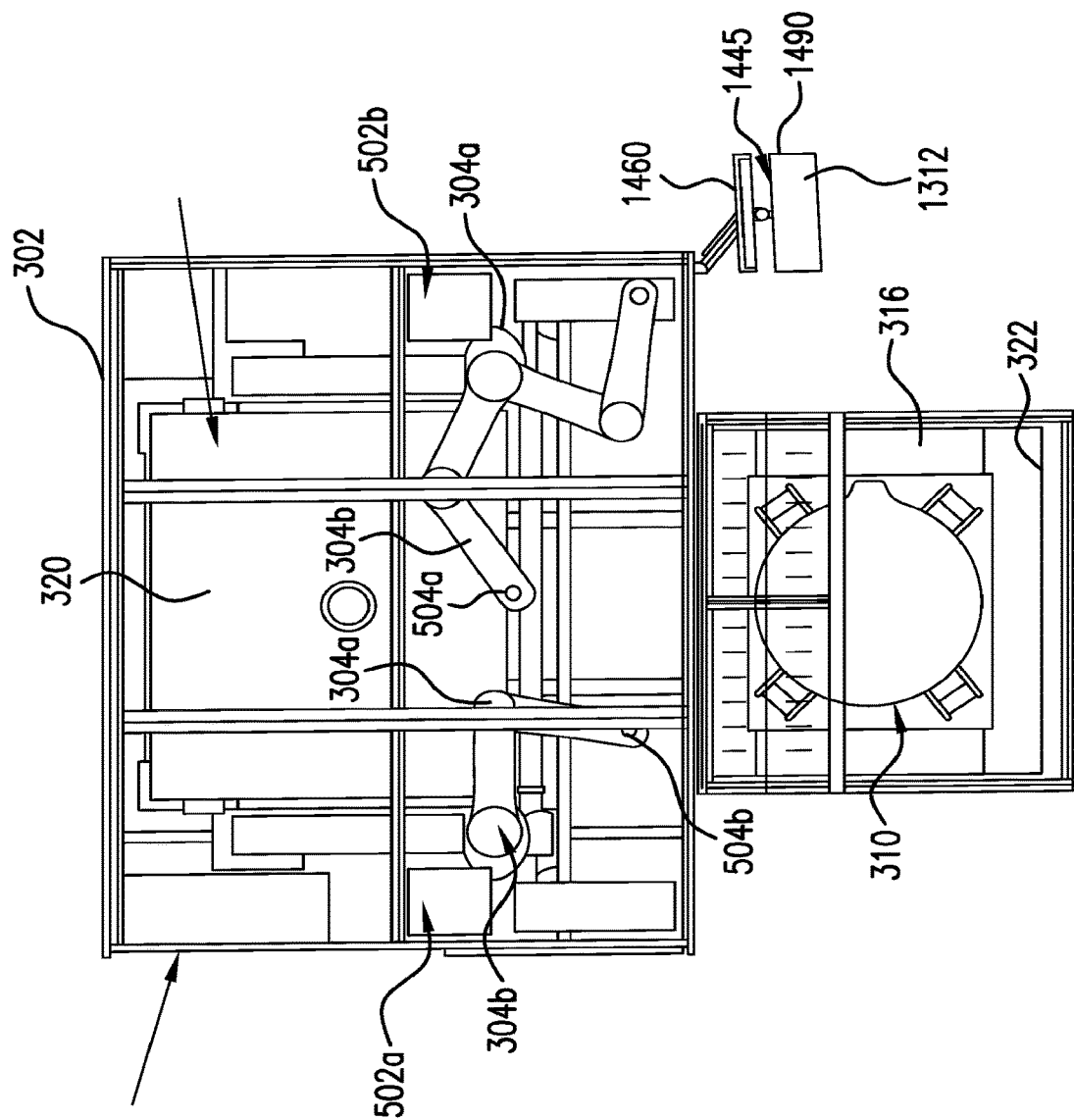
FIG. 5 illustrates and underfill machine.

With particular reference to FIG. 5, the referenced right and left robots 304a, 304b are shown at the front aspect of the illustrated under-fill machine 302. Also shown is a circuit board 310 placed upon a carrier 316 at the front of the machine 302 in preparation for insertion into the accommodating input 314. Of note, the carrier 316 shown, when placed in communication with certain electronic elements, may cause the carrier 316 to serve as the lower heater 322 discussed throughout.

Also shown in FIG. 5 are left and right dispense controllers 502a, 502b that allow for the dispensing of under-fill by the dispensing heads 504a, 504b associated with each of the right and left robots 304a, 304b. Upon dispensing of the under-fill to components on the circuit board 310, the circuit board components may be subjected to capillary action of the under-fill due to the heating of at least the lower heater 322 discussed throughout, and, in some embodiments, indexing of the board 310 to subject the ones of the components to the overhead heater 320. Further, in certain embodiments, components on certain aspects of the board 310 may be subjected to the overhead heater 320 for preheating, and then indexed out of the overhead heater 320 to be subjected to the dispensing heads 504a, 504b. And yet further, in some embodiments, underfill may be provided, and capillary action caused by the lower heater 322, and thereafter aspects of the board 310 may be indexed into association with the overhead heater 320 for purposes of curing, by way of non-limiting example.

More particularly with respect to FIG. 5, several motor controls may be provided for each robot, such as in conjunction with the dispense controllers 502a, 502b. Such motor controls may be actuated in accordance with the predetermined programs/recipes 1490 executed by the processing system 1312, and/or such actuation may be modified by an operator interacting with the processing system 1312, such as an operator interfacing with the operator display and control 1445, 1460 discussed herein. Further, although the robotics 304a, 304b shown in FIG. 5 have four axes of movement, it will be appreciated that other multi-axes robots may be used in embodiments. Moreover, it will be understood by the skilled artisan in light of the discussion herein that robotics employing gantrys may be unsuitable for use with embodiments such as that of FIG. 5, at least because such gantry-based embodiments might be inoperable in conjunction with the presence of the overhead heater 320 discussed throughout.

Of note, the robotics 304a, 304b shown may include, attached thereto, one or more end-effectors to perform the functions discussed throughout upon the exposed portions, i.e., those portions not underneath the overhead heater 320, of the printed circuit board 310. That is, the end effector associated with the robots may be or include any type of dispensing head 504a, 504b, by way of non-limiting example, such as to dispense the underfill discussed throughout. For example, in addition to a droplet dispenser, embodiments may include a spray coating dispensing head, a gripper end effector, or the like, by way of non-limiting example. Moreover, both the robot 304 and the dispensing head 504 may be under the control of the disclosed processing system 1312.

Figure 6:
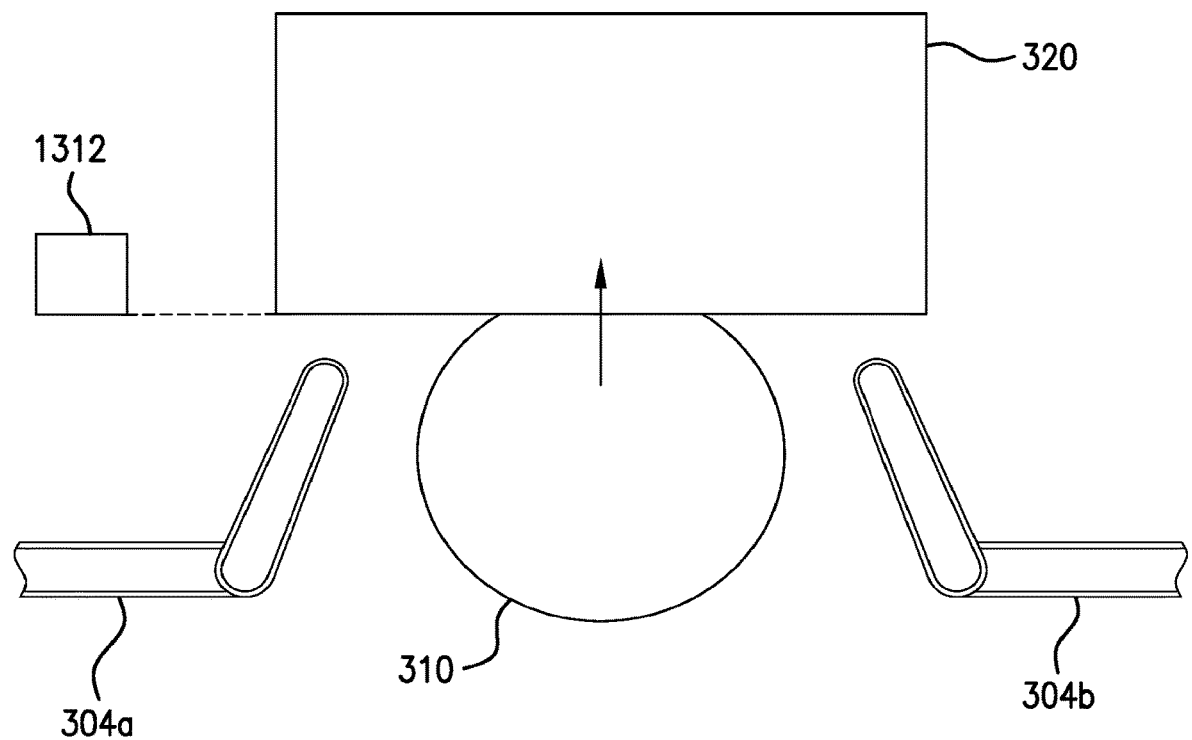
FIG. 6 illustrates indexing a board to an overhead heater.
Figure 7:
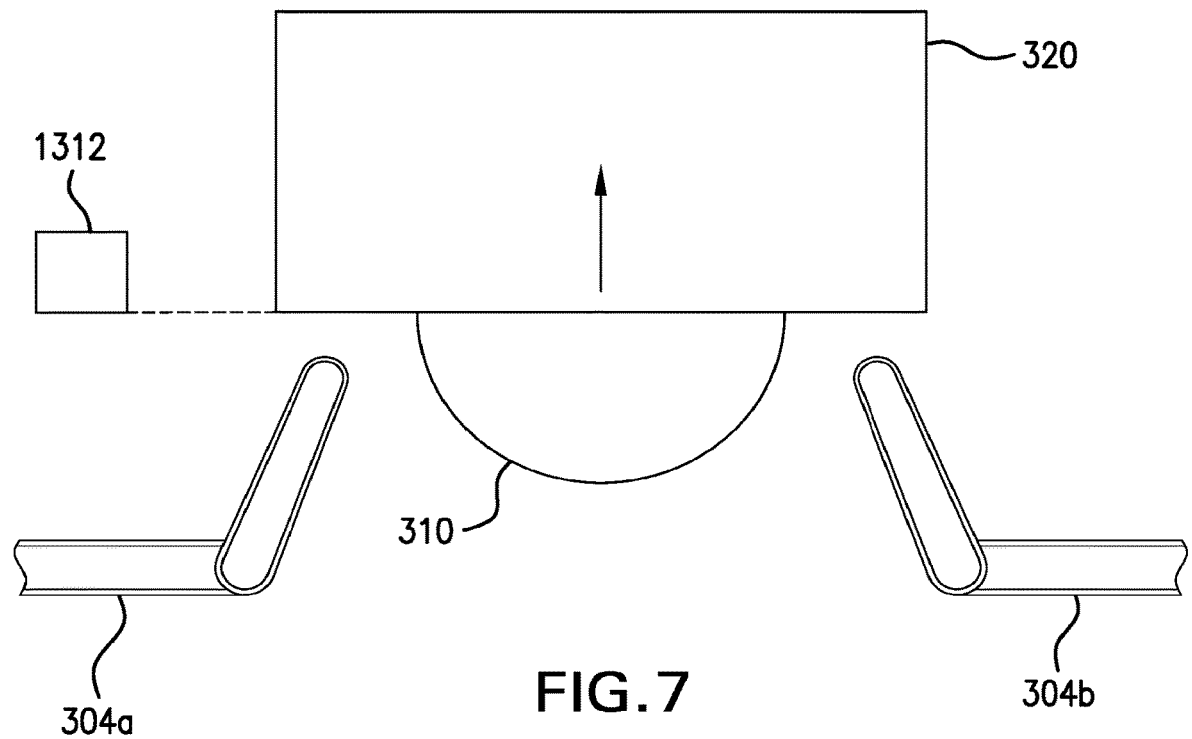
FIG. 7 illustrates indexing a board to an overhead heater.

Also illustrated in FIG. 5 is the overhead heater 320 discussed throughout. The application of heat by the overhead heater 320 is shown with greater particularity in the illustration of FIGS. 6 and 7. As shown in FIGS. 6 and 7, the board 310 may be only partially inserted, i.e., may be indexed, into the overhead heater 320. Thereby, refined temperature control and/or enhanced heating may be provided for both the portion of the board 310a subjected to the overhead heater 320, and/or the portion of the board 310b indexed outside the overhead heater 320, such as when the overhead heater 320 is operated in conjunction with the lower heater 322 discussed herein by the disclosed processing system 1312.

Further, the left and right robots 304a, 304b discussed herein have ease of access to operate on the upper facing portion of the circuit board 310 that is indexed to the outside of the overhead heater 320, as will be understood to the skilled artisan in light of the discussion herein. Thereby, refined and/or enhanced heating may be provided by the overhead heater 320, while indexing portions of the board 310 outside the overhead heater 320 allows for application of underfill, as discussed throughout, by the robot(s) 304a, 304b, and the use of this refined and/or enhanced heating to improve the capillary action for the underfill application. That is, only aspects of, half of, or all of the board 310 may be subjected to overhead and underside heat simultaneously by the lower heater 322 and the overhead heater 320; only underside heat from the lower heater 322; only heat from the overhead heater 320; or no heat at all.

The refined and enhanced heating and heat control allows not only ease of access for the robots 304 to the board 310, but also allows for a highly refined delineation of labor as between the robots 304 in three dimensional space based on the indexing of the board 310 out of the overhead heater 320. That is, the right and left robots 304a, 304b shown in the disclosed example may each may each be responsible for placement of components and/or under-fill on one quarter of the subject printed circuit board 310 and, as such, the board 310 may be indexed out from underneath the overhead heater 320 in halves or quadrants, for example. That is, the top heater 320 may accommodate and/or heat half of the area of a partially or substantially circular circuit board 310, while the other half of such a board 310 may extend outside the top heater 320 for access by the one or more robots 304. By way of example, half of this exposed other half of the board 310 may be accessible to the left robot(s) 304a, and half of the exposed half may be accessible to the right robot(s) 304b; therefore, one quarter of the subject board is available to each of the right and left robot(s) 304b, 304a in the foregoing example, and the board 310 may thus be indexed out from beneath the overhead heater 320 in a manner suitable to provide awareness to the processing system 1312 of which quadrant of the board 310 each robot is presently working in.

Further, because the large boards treated in some of the embodiments may have large numbers of components thereon, such as up to 1300 components on one side of the board, it may be preferable that component under-fill is an ongoing process. Thereby, while no heat may be applied to the board, it may typically be preferable that the lower heater 322 subjects the entire board 310 to heat from beneath, while the upper heater 320 may semi-continuously or continuously warm other aspects of the board 310 as the board is partially or substantially, and periodically or continuously, indexed/rotated out from beneath the upper heater 320 to allow for under-filling of components only in discrete radial sections of the board 310. Accordingly, the board may be heated from beneath with a consistent heat level, and the heat applied from the overhead heater 320 may improve the capillary action of the applied under-fill if that under-fill is applied substantially contemporaneously after exposure of that radial portion to the underfill dispensing robot 304 as that radial portion is indexed out from underneath the overhead heater 320. Likewise, after the application of underfill, indexing/rotation of that radial portion under the overhead heater 320 after application of underfill may enhance capillary action, and/or may provide curing of board components and/or underfill, by way of non-limiting example.

Figure 8:
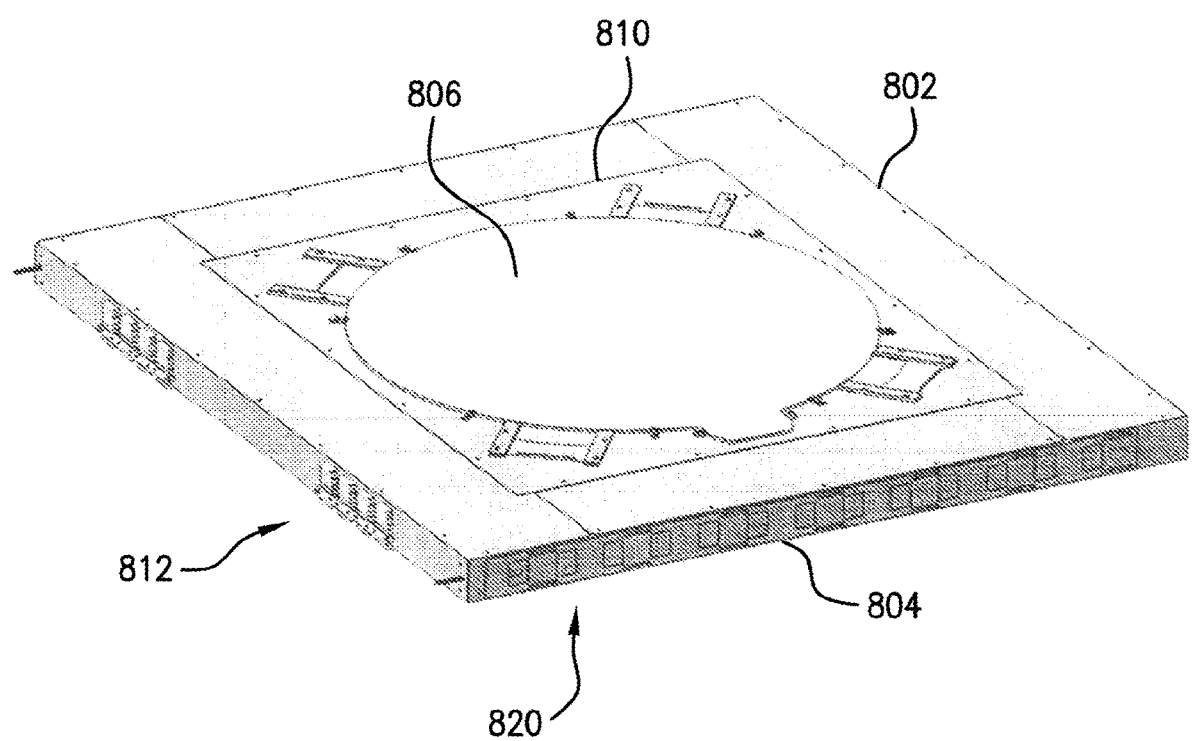
FIG. 8 illustrates a carrier.
Figure 9:
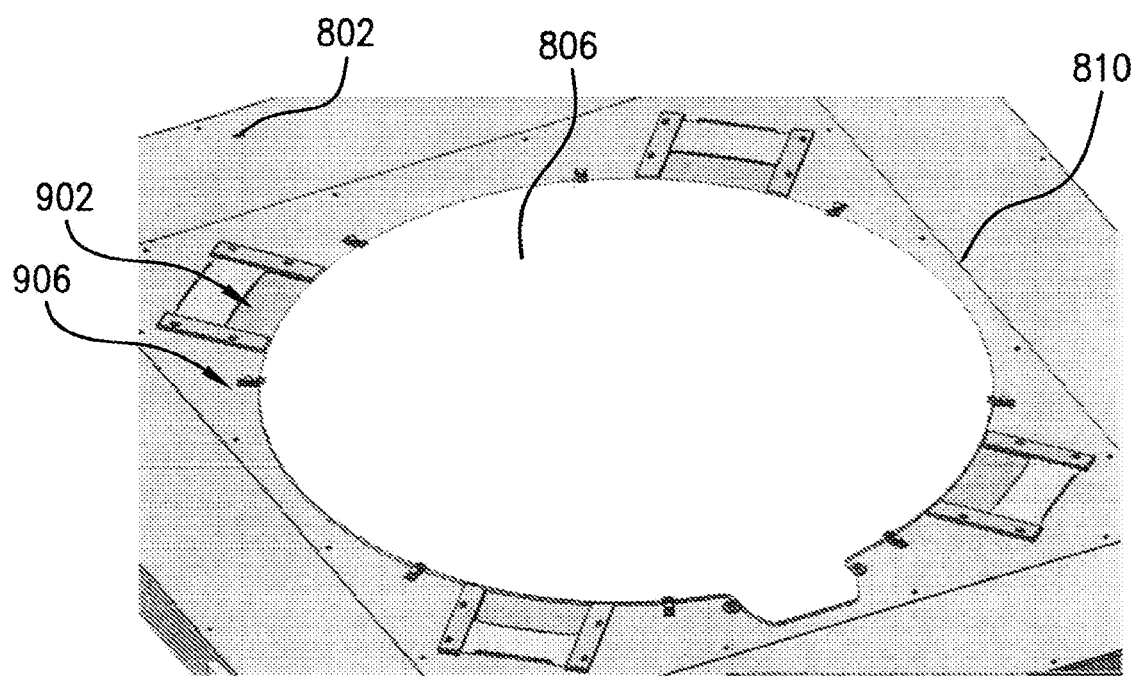
FIG. 9 illustrates a carrier.
Figure 10:
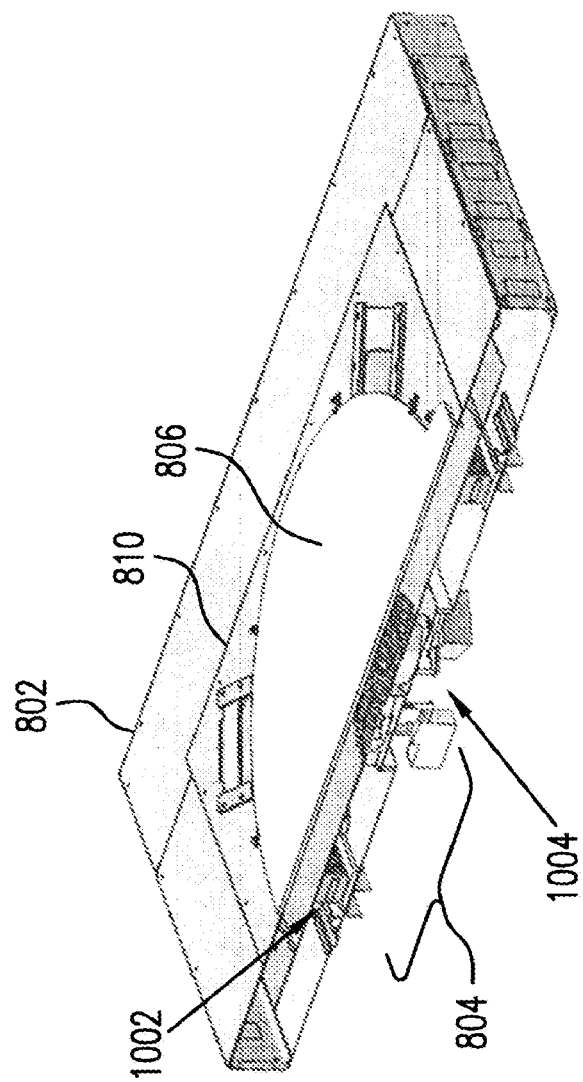
FIG. 10 illustrates a carrier.

FIGS. 8, 9 and 10 illustrate, with particularity, an exemplary board carrier 802 inclusive of a lower heater 804 for use in the embodiments. Although it will be noted that the illustration of FIGS. 8, 9 and 10 show with particularity a round circuit board 806 and corresponding carrier 802 (and/or carrier frame inset 810), it will be understood that other types and shapes of large circuit boards may be similarly employed with a carrier 802 using the disclosed teachings.

FIG. 8 illustrates a square carrier 802 sized to enter the accommodating input 314 discussed throughout. In the illustration, a forced air heating system 804 is used for the lower heater 804 included within the carrier 802. Also included may be a plurality of resistance temperature detector (RTD) connections 812, such may allow for environmental monitoring of the carrier 802 and thereby the board 806 associated therewith, such as to provide temperature monitoring of certain portions of the carrier 802 and/or the board 806.

As discussed, RTD connections 812 may be provided in association with the lower heater/carrier 804. These RTD connections 812 may be suitable to provide a feedback control loop that may maintain board 806 and/or lower heater 804 temperatures at or close to a desired set point. Further, the carrier 802 may provide one or more probes or probe connections, such as to enable the association of temperature probing with or at one or more points on a circuit board 806 associated with the carrier 802. Thereby, individual temperature points of the printed circuit board 806 may be monitored, as may be temperature differentials between various parts of the board 806, such as those aspects of the board associated with the overhead heater 320 and not associated with the overhead heater 320 at any given time, by way of non-limiting example.

Also of note with respect to FIG. 8, side vents 820 may be provided in association with the lower heater/carrier 804 such that the carrier 802 may be cooled as well as heated. By way of example, such cooling may allow an operator to expediently be able to touch the printed circuit board 806 proximate in time to the removal of the printed circuit board 806 from association with the overhead heater 320 or the lower heater 804. These side vents 820 may only partially provide a cooling system for the carrier 802, such as wherein the cooling system may be further enhanced if the heaters are turned off but nevertheless the forced air airflow is actuated, which heaters and forced airflow within the carrier 802 are further discussed herein with respect to FIG. 11.

FIG. 9 illustrates a carrier 802 which may be inclusive of lower heater 804, similar to the exemplary embodiment of FIG. 8. Illustrated with greater particularity in FIG. 9 are one or more handles 902, or slider openings 902, wherein openings/handles 902 may be created by generating openings to allow for manual access to the board 806 resident within the carrier 802, such as for loading and unloading thereof. By way of example, the slide openings or handles 902 may be spring actuated, such that an operator needn't actively close the openings after use.

Also included in FIG. 9 are one or more exemplary clips 906, which may be provided to hold the board 806 substantially flat, such that warping will be prevented when the board 806 is subjected to heat from the lower 804 and/or overhead heaters 320 discussed herein. The clips 906 may be any type known to those skilled in the art, such as flex/forgiving clips, rotate-over clips, or the like. By way of example, the clips 906 may be inset, such that they may be moved in and out so as to accommodate different sizes and shapes of circuit boards 806 for association with the illustrated carrier.

Of note with respect to the clips 906, warpage may be a particular issue for especially thin boards that may be associated with the disclosure. For example, boards 806 used in the disclosed machine 302 and system may be of 5 millimeters in depth, although other wafer depths, such as 3 millimeters or less or 7 millimeters or more, may be similarly employed. In each such case, the disclosed clips 906 may forgivingly brace the board to help to prevent warpage.

Other suitable aspects to prevent wafer warpage may similarly be included in the embodiments. For example, steel support pins may be provided, such as uniquely in each carrier 802 in the form of a circuit board frame 810 matched to the active area of a board 806 matched to that board frame 810, to hold up the printed circuit board 806 during processing and thereby prevent warpage. That is, for example, the disclosed steel pin pattern may be patterned to match the board patterning of active areas so as to avoid touching components or traces on the board 806, while also suitably preventing warpage. Moreover, the placement of such steel pins, such as in conjunction with clips 906, rather than the tight board clamping employed in the known art, may allow for expansion and contraction of the board 806 with temperature variations, such that warping is further prevented that might otherwise occur due to these temperature variations.

FIG. 10 illustrates a particular embodiment of a carrier/lower heater 804. In the illustration, heaters 1002, such as finned and/or strip heaters, provide heat, and corresponding air circulators 1004, such as air recirculation fans, having fluidic access to the heated air generated by the finned heaters 1002 may be employed in order to provide the forced air heating system within the lower carrier 804, as discussed herein throughout.

Figure 11:
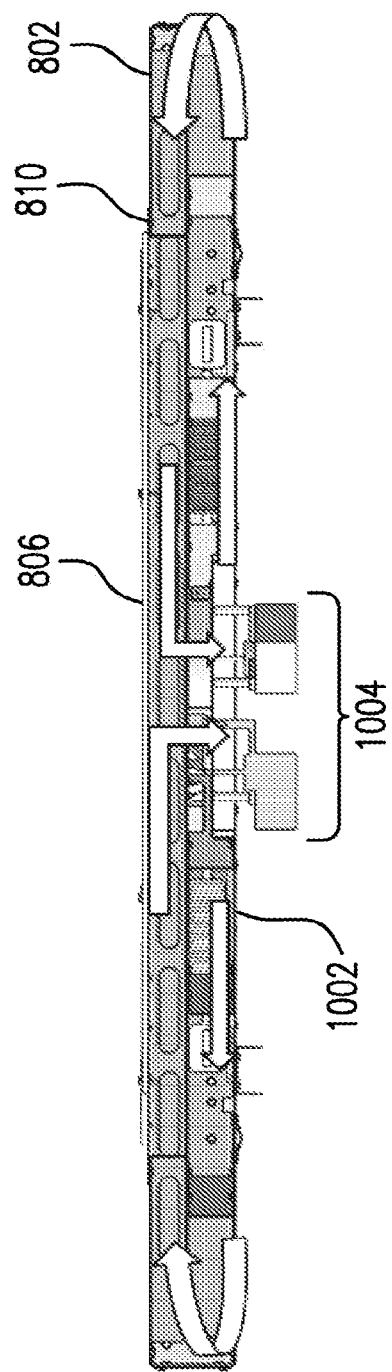
FIG. 11 illustrates a carrier.

More particularly and as shown in FIG. 11, heat may be generated by the heaters 1002, such as the finned heaters discussed with respect to FIG. 10, and this heat may be circulated outwardly and upwardly from the center, lower portion of the carrier 804 (see flow arrows of FIG. 11). Thereby, the forced air heat may be substantially evenly distributed from the outer part of a lower portion of the board 806 associated with the carrier 802 towards the center point of the board, whereafter the heat may be redirected downward from the center point of the board 806 and away therefrom.

Further, and as is made evident from the illustrative embodiments of FIGS. 8, 9, 10 and 11, the inset frames 810 may be specialized, proprietary, or generic given the type/size of the board 806, and may be readily inserted and/or removable from the disclosed carrier 802. Thereby, modularity may be provided for the carrier 802, wherein a carrier 802 may be subjected to removal of a frame 810 and insertion of a new frame 810 to accommodate different ones of board 806 on carrier 802. That is, provided inset frames 810 may be of various sizes and shapes to provide an accommodating location on a carrier 802 for any number of different boards. That is, upon insertion of each different frame 810 into the carrier 802, a different type and/or size of board 806 may be suitable for receipt onto the carrier 802. Such board variations may include shape variations of board 806, such as circular, diamond, square shapes, and so on, or size variations of board 806, such as 32 inches, 38 inches, 42 inches, 48 inches, and the like.

Each frame 810 may also include or otherwise enable the heating and/or airflow capabilities associated with a respective carrier 802, such as discussed herein with respect to FIG. 11. For example, heating and/or cooling may be circulated/recirculated through the frame 810 with reduced or eliminated outflow in association with the lower heater 804, as discussed above, irrespective of which frame variation is placed within a carrier 802 acting as the lower heater 804. Correspondingly, each frame 810 may include one or more of the heater 1002 and fan 1004 components discussed throughout as being associated with the carrier 802 acting as the lower heater 804.

Figure 12:
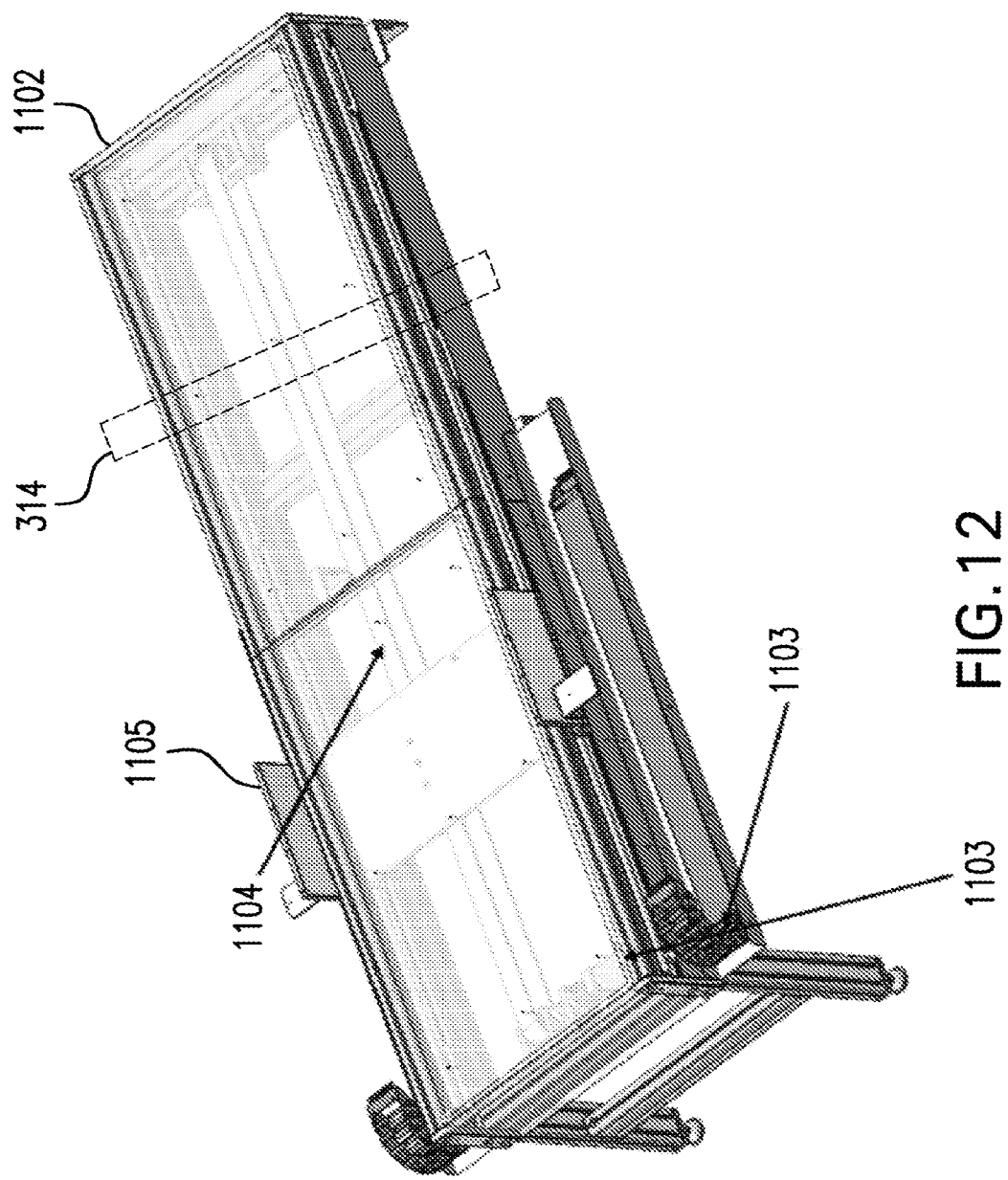
FIG. 12 illustrates a conveying input.

FIG. 12 illustrates an aspect of an accommodating input 314 for use with the disclosed underfill machine 302. As shown, a carrier having a board thereon (not shown) may be movably/slidably/conveyably associated with a slide conveyer 1102—that is, a conveyer 1102 may include a brace 1105 suitable to manually or electro-mechanically move the carrier toward the accommodating input 314, and/or to move the carrier toward and away from the overhead heater 320 and robot(s) 304 within the chamber 306 of the underfill machine 302, once the carrier and board is physically associated with the brace 1105. Accordingly, the disclosed carrier may be frictionally or otherwise associated with the slide/conveyer 1102, such that the printed circuit board and/or carrier is manually or automatically moved through the accommodating opening of the underfill machine and/or into association with the robotics and heater systems within the chamber 306 discussed herein.

Moreover, one or more conveyance 1103 and timing systems 1104, such as may be automatically executed by the processing system 1312, may be associated with the slide conveyer 1102 (or other conveyer type), such that the board is moved at a predetermined rate into association with the robotics, and thereafter into the overhead heater, as discussed throughout, by conveyance of brace 1105. It will be understood that other similar systems may be used in association with the movement through the accommodating input 314 and/or within the chamber, such as conveyor belt, roller-based passive or manual systems, or the like.

Figure 13:
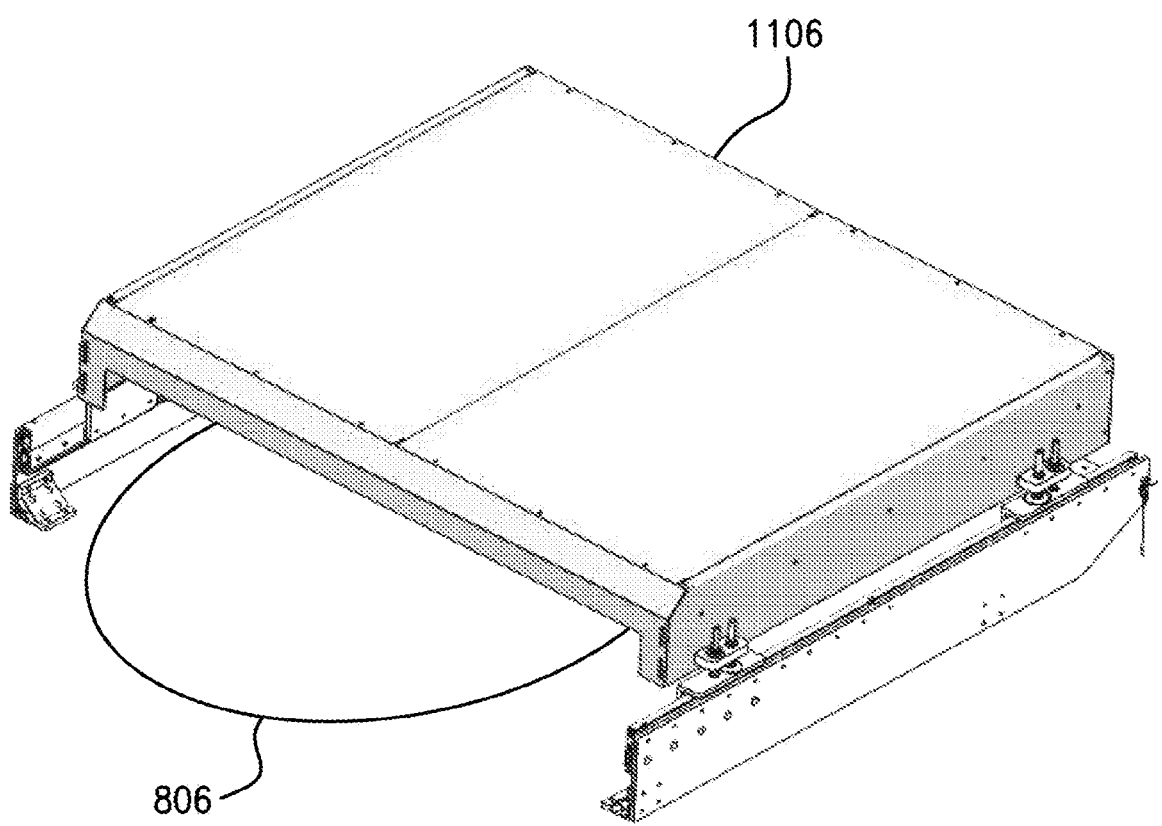
FIG. 13 illustrates an overhead heater.

FIG. 13 illustrates a particular exemplary overhead heater 1106 that may be used in the embodiments. Although the embodiment shown may be an inductive plate heater, it will be understood that this or other types of overhead heaters 320, such as infrared or forced air, may be provided as the top heater 1106, as discussed throughout. Of course, the manner of heating provided by the top heater 1106 may be a design consideration that is affected by other aspects of the underfill machine 302. For example, to the extent infrared curing is to be used for the circuit board component placements, solder, or underfill in the embodiments, it might be a poor design choice to use an infrared overhead heater 320.

Figure 14:
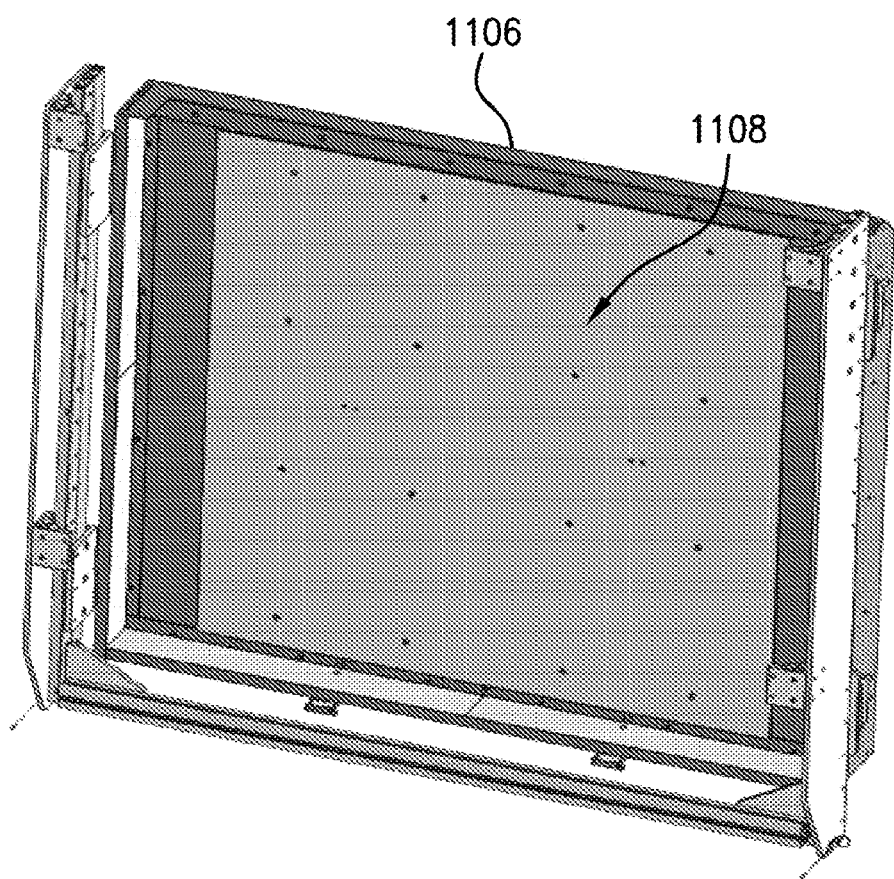
FIG. 14 illustrates an overhead heater.

FIG. 14 illustrates an overhead heater 1106 similar to that illustrated in FIG. 13. In the illustration, the underside of the heater 1106 includes a heat plate 1108 suitable to provide heat adjacent to that portion of the circuit board that is placed proximate to the illustrated heat plate 1108. As noted throughout, only a portion of the circuit board may be associated with heat from the overhead heater 1106 at any given time. Yet further, although a single zone induction heat plate 1106 is shown, it will be appreciated that multi zone heat may be provided by the overhead heater without departing from the disclosure.

More particularly with respect to FIGS. 13 and 14, the exemplary overhead heater 1106 design disclosed allows for staging of the circuit board by indexing the board into the overhead heater 1106 during the underfill process. Accordingly, the overhead heater may serve a variety of functions during the staged indexing discussed herein throughout. By way of non-limiting example, the overhead heater 1106 may serve to preheat portions of the board. Alternatively, the overhead heater 1106 may serve to cure aspects of the circuit board, or may serve to aid in the capillary action of the underfill process by providing additional heat, such as wherein the board must be raised to a temperature of greater than 50° Celsius to allow for suitable capillary action.

The staged indexing of the board into the overhead heater, such as overhead heater 1106, such as for the disclosed underfill process promotes process stability. For example, the disclosed robotics 304 may work on only an aspect of the board at a given time, such as working on only a quadrant of a circular board at a given time as discussed above, while the remainder of the board may be cured, preheated, or subjected to temperature maintenance, by the combination of the overhead 1106/320 and/or lower heaters 322.

Figure 15:
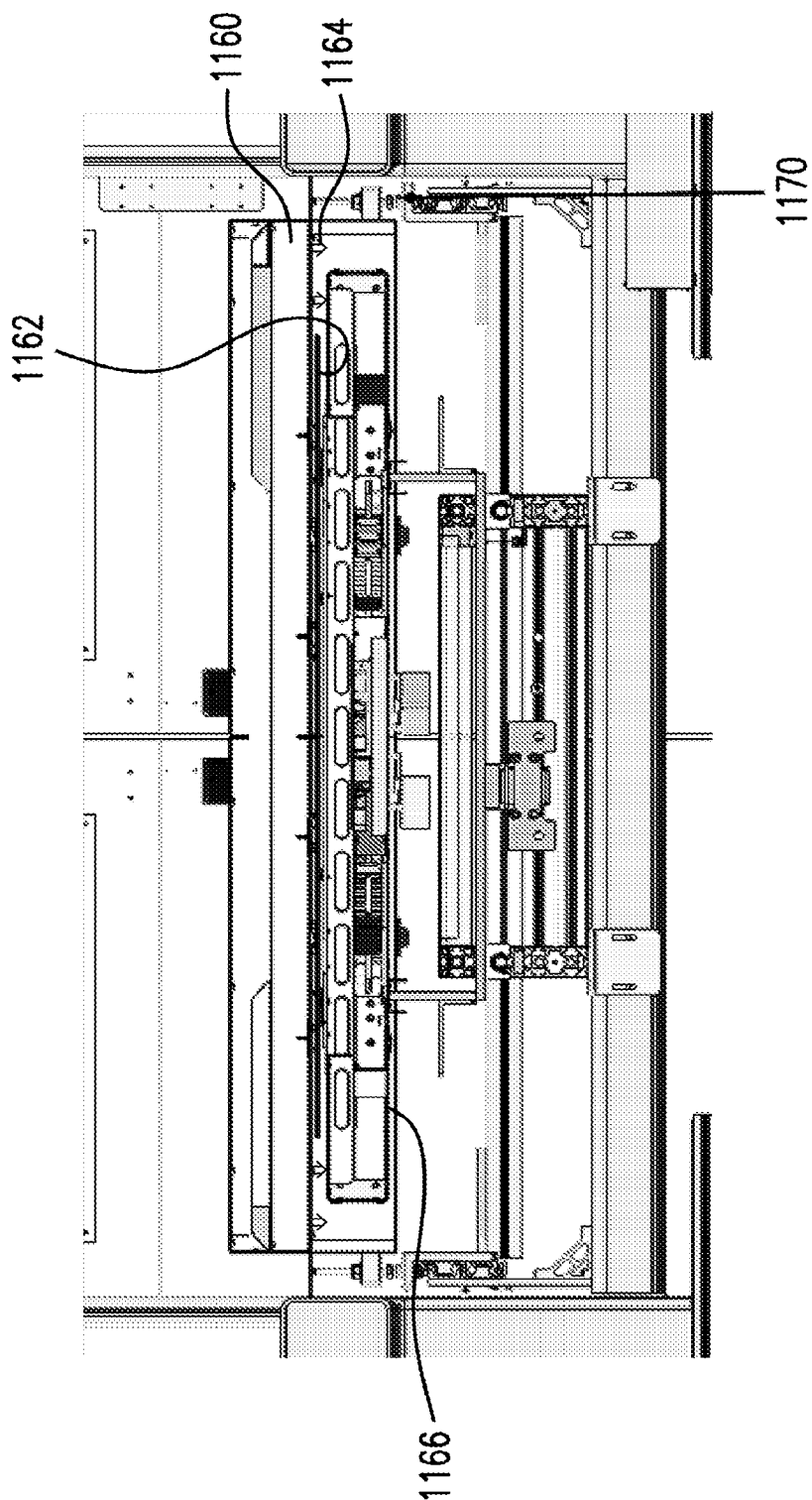
FIG. 15 illustrates an overhead heater.

FIG. 15 shows another exemplary illustration of an overhead heater 1160 that is operating upon a circuit board 1162 that has been placed proximate and/or under the heater 1160, such as by passing through an accommodating opening. In the illustration shown, the overhead heater 1160 provides downward heating 1164 onto the circuit board 1162, and the circuit board 1162 is associated with a carrier 1166 that may provide the lower heater. Also illustrated is a height adjustment 1170 for the overhead heater 1160, wherein the proximity of the generation of heat 1164 to the circuit board 1162 under the overhead heater 1160 may be manually or automatically adjusted in the embodiments.

Figure 16:
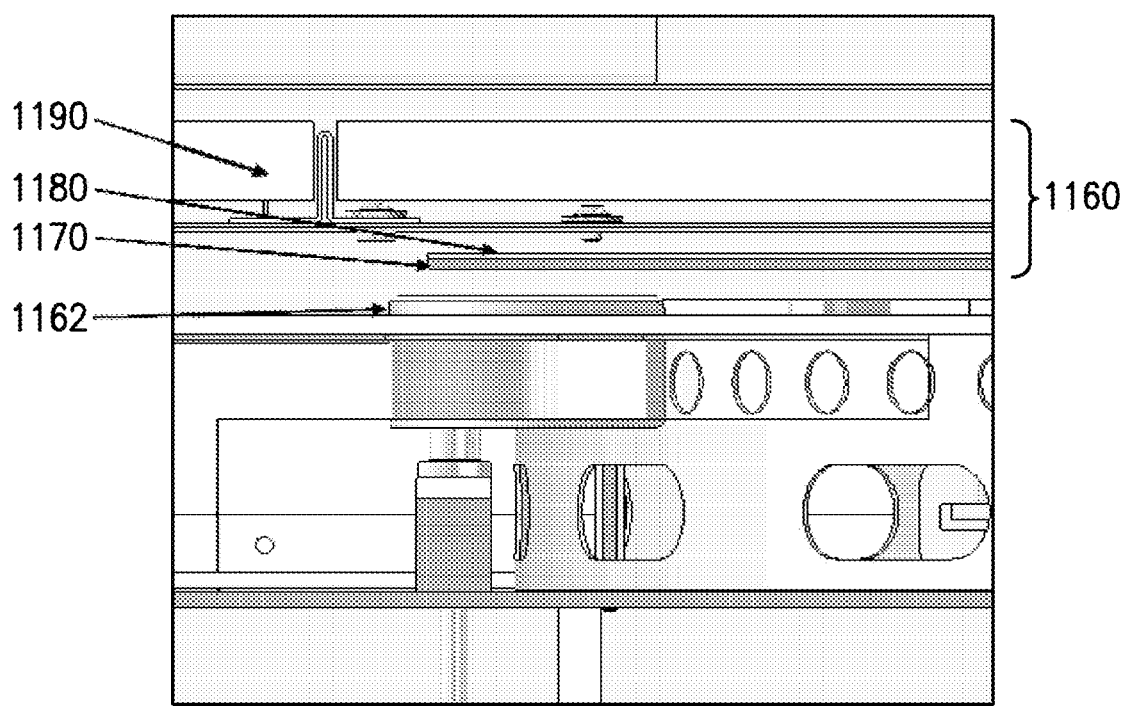
FIG. 16 illustrates an overhead heater.

FIG. 16 illustrates a close-up of the exemplary embodiment of FIG. 15. As is evident in FIG. 16, the circuit board 1162 may be brought into substantially close association with the heat plate 1170 of the overhead heater 1160, such as by the manual or automated height adjustment 1170 for the overhead heater 1160 discussed above with respect to FIG. 15. Further, adjacent to the heat plate 1170 of the overhead heater 1160 may be provided a heat generator 1180, whereby the heat generator 1180 may provide and/or stimulate the heat to or by the heat plate 1170 such that the heat plate 1170 can provide the heat to the printed circuit board 1162. "Above" the heat generator 1180 may be provided insulation 1190, such that the heat from the overhead heater 1160 is substantially prevented from "leaking" outwardly at the top of the overhead heater 1160 into the chamber 306. Thereby, temperature within the chamber 306 of the underfill machine 302 discussed herein may be controlled such that stray heat and/or unstable temperature fluctuations are not the cause of undesired effects on the printed circuit board 1162 when the circuit board 1162 resides within the chamber 306.

The operation(s) run on the board discussed throughout may comprise a series of process steps encompassed by a software "recipe" executed by the processing system. A recipe may be automatically or manually selected, and may execute once the board is associated with the carrier, or after the board is entered through the accommodating input. A recipe may consist of a set of defined commands, such as a robot motion, a dispense, a power to a heater, or an alignment, by way of example. Commands can be grouped into sub-routines, for example, as will be understood to those skilled in the art.

Figure 17:
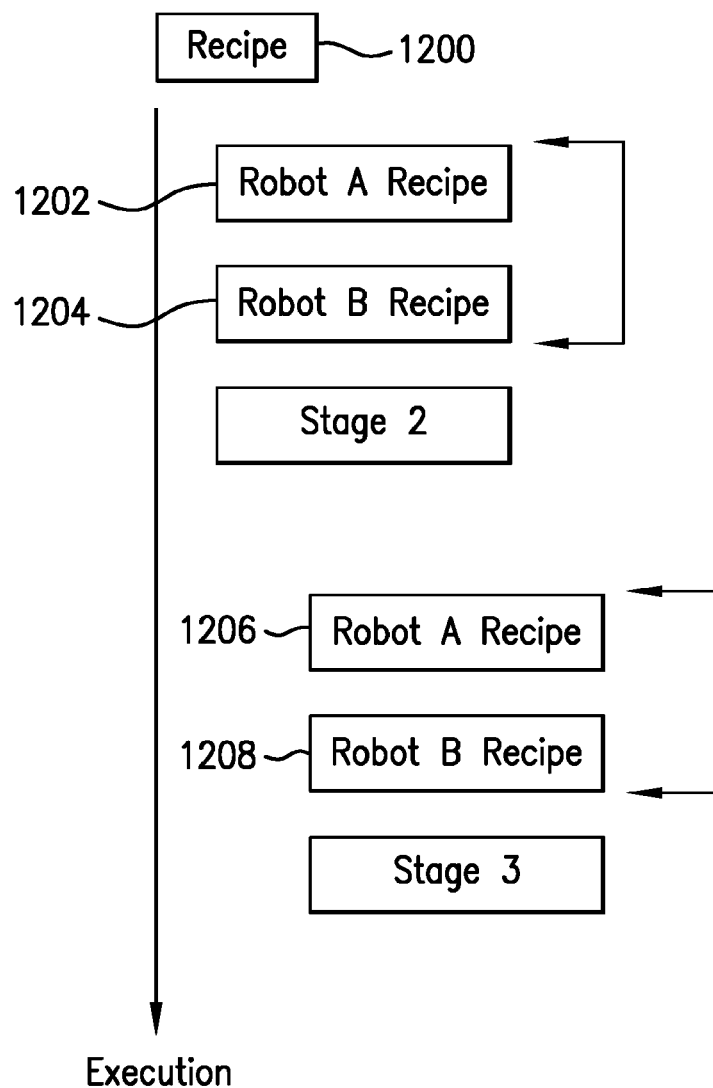
FIG. 17 illustrates execution of underfill recipes.

By way of example, a recipe may include loading of the board into the accommodating input; bringing the lower heater to a certain temperature once the board is within the chamber, or prior to the board entering the chamber; moving the robots to each position defined in the recipe to dispense underfill (such as wherein each of two robots each handles a quadrant of a circular board), wherein the robots are defined in the recipe to be operable only on those portions of the board indexed outside of the overhead oven; and actuating the overhead heater to a predetermined temperature for any aspect(s) of the board indexed thereunder. In some embodiments, distinct sub-recipes 1202, 1204, 1206, 1208 to recipe 1200 may be run by each of multiple robots 304 (labelled "Robot A" and "Robot B" in FIG. 17), in series or in parallel, and heater aspects of the recipe(s) may be independent recipes running in parallel with the robotic operation recipes, or may be part of the robotic recipes, all running as aspects of the processing system, as illustrated in FIG. 17. That is, a series of recipes can be concatenated together into a single recipe, and/or recipes may be parallel or sequenced for proper operation, such as by the processing system and/or the "teaching" mode discussed below.

Further, each recipe may be uploaded and/or include a "teaching" aspect, wherein machine vision (such as Cognex machine vision) and/or manual operation (such as under the control of the user display console) allow for the robots to "learn" or modify the proper execution of a given recipe. That is, the robots may have an actual and a correct position in the course of creating, refining or executing a recipe, and adjustments may be made in a teaching session to align the two for each component/underfill on a given type/size of board.

Figure 18:
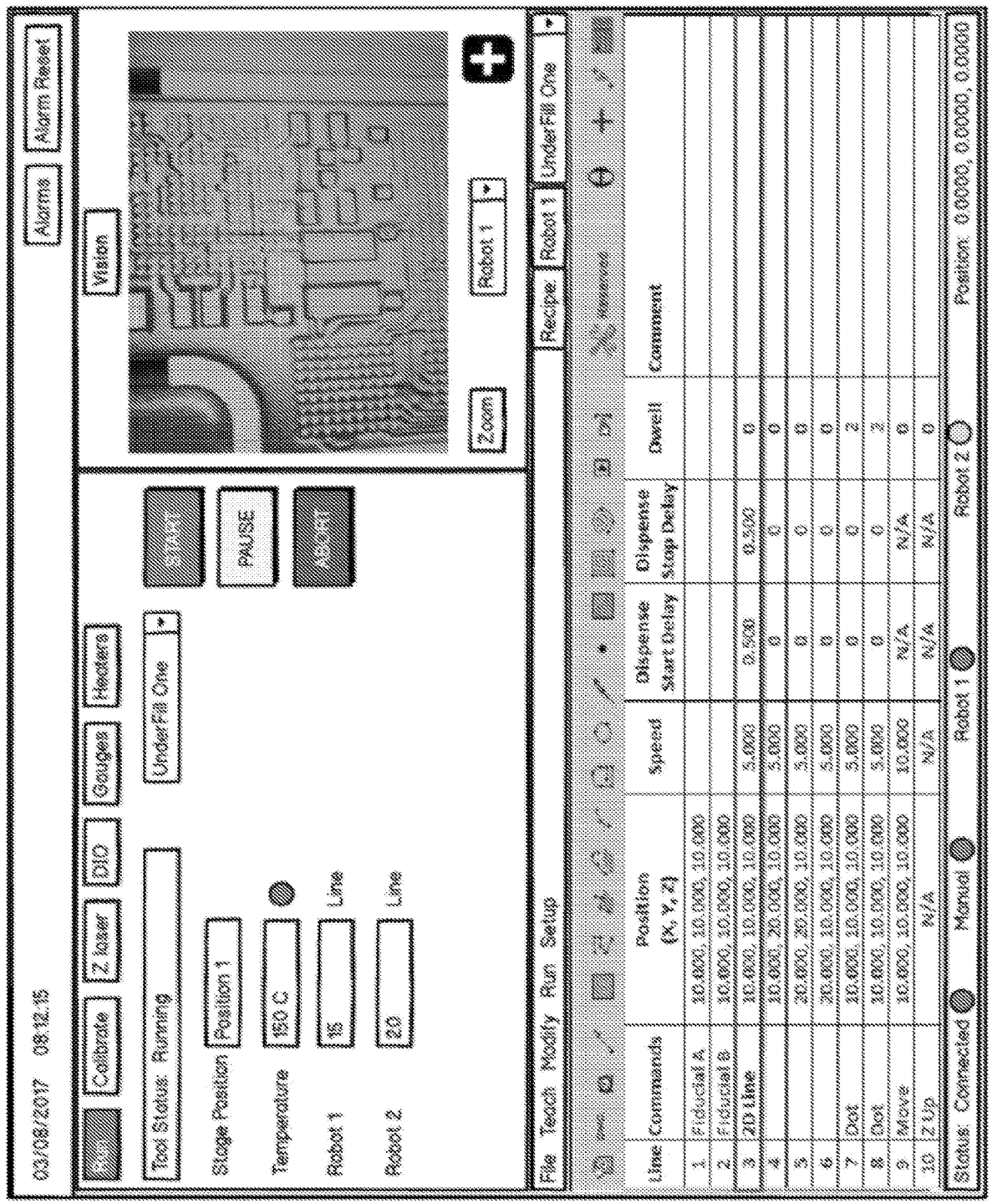
FIG. 18 illustrates a graphical user interface.
Figure 19:
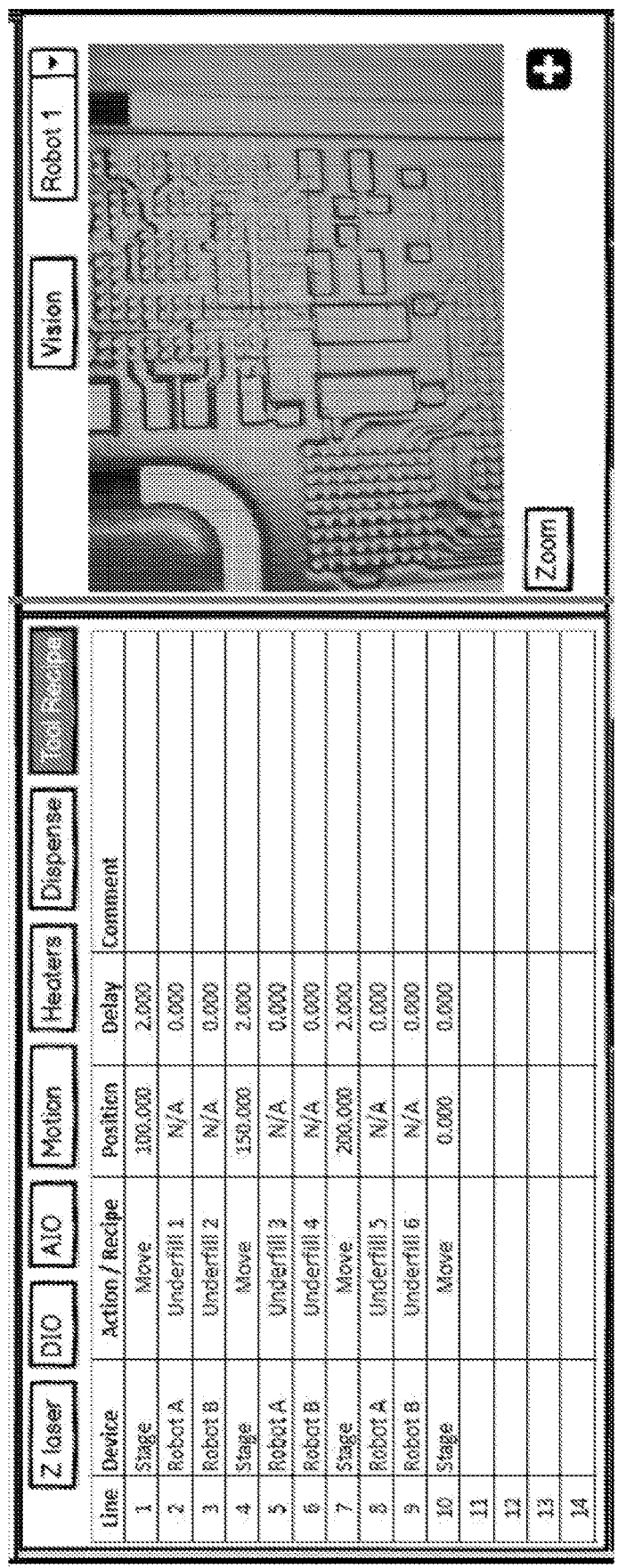
FIG. 19 illustrates a graphical user interface.
Figure 20:
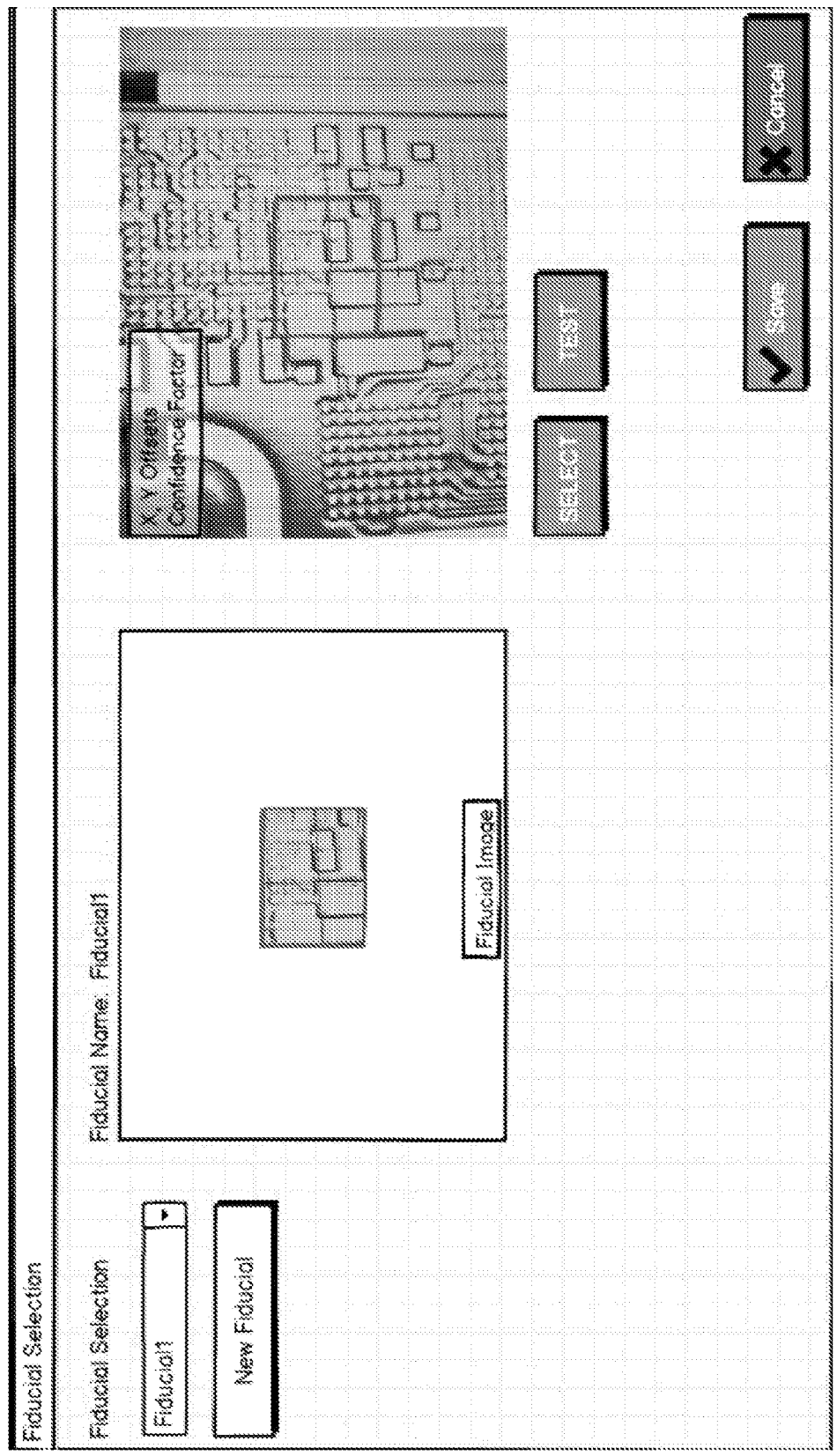
FIG. 20 illustrates a graphical user interface.

Further, the teaching session may allow for modification, such as by an operator, of aspects of the receipt being taught, and/or entry of a new recipe. For example, teaching may indicate X, Y, Z location(s) for movement and/or dispense. Also indicated may be speed and/or dwell, for example. Heating, fiducials and/or overhead heating indexing may also be associated with a teaching. The foregoing is illustrated in the exemplary user interface, such as may be associated with the operator display and control 1445, 1460 discussed herein, of FIGS. 18, 19, and 20.

Figure 21:
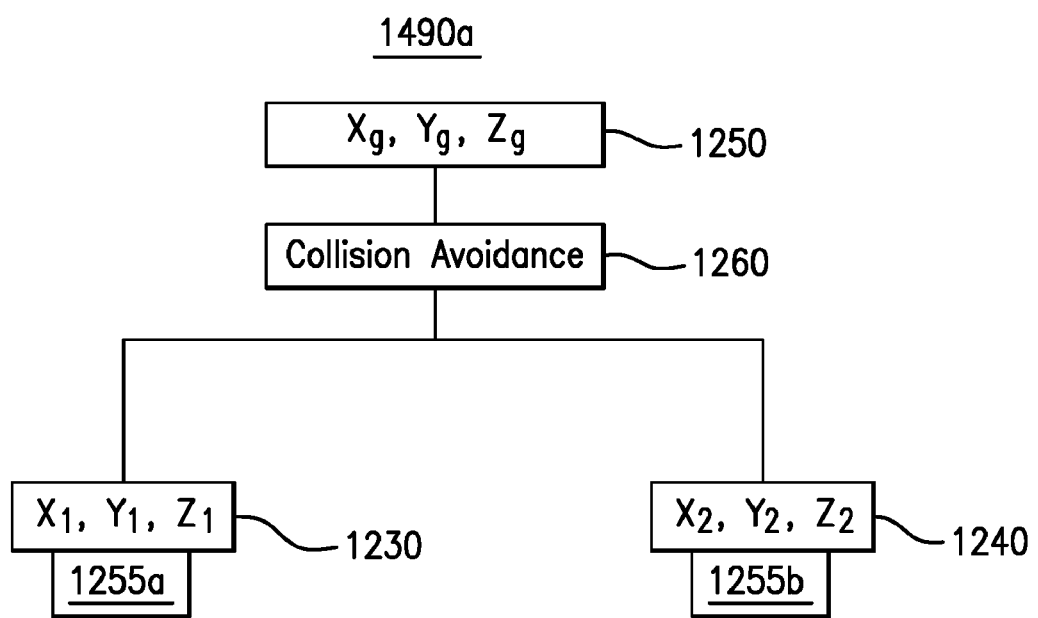
FIG. 21 illustrates collision avoidance in an underfill machine.
Figure 22:
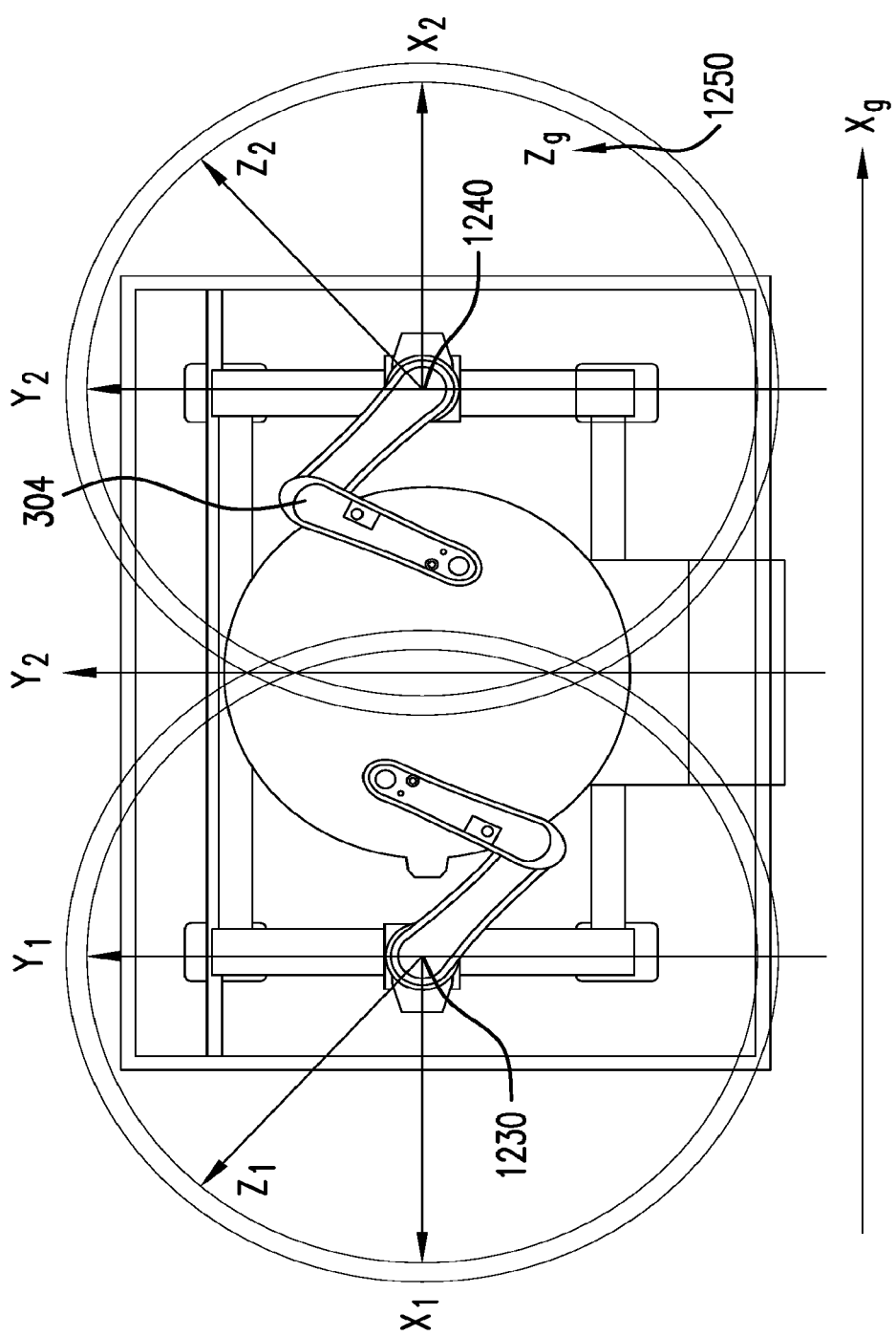
FIG. 22 illustrates collision avoidance in an underfill machine.

A series of movement, dispense, dispense start and stop, speed and dwell teachings may comprise a discontinuous, semi-continuous, or continuous "path" executed pursuant to a recipe. In embodiments, the paths of multiple robots may necessarily be deconflicted, such as to perform collision avoidance between multiple robots having the capabilities to simultaneously take the same position in three-dimensional space. By way of example and as shown in FIG. 21, in such a case, a "supervisory" algorithm 1490$a$, such as a subroutine, may include a tracking of the X1, Y1 and Z1 1230, and X2, Y2, and Z2 1240 movements of each of two (such as one left and one right, herein corresponded as robots "1" and "2", respectively) robots independently, and combine the tracking of the multiple robots onto a global Xg, Yg and Zg coordinate grid 1250 that encompasses all or a portion of the three dimensional space within the chamber (such as inclusive of the overhead heating space, or solely with respect to those aspects of the board indexed out of the overhead heater). Thereby, the supervisory subroutine may additionally overlay the global Xg, Yg and Zg grid with the timing, function, speed, and dwell 1255 of each robot on its respective independent grid (X1, Y1, Z1; X2, Y2, Z2) to insure at function 1260 that the X/Y/Z coordinates are never the same for both robot recipes at the same time on the global (Xg, Yg, Zg) grid, and thereby provide collision avoidance. This is also illustrated with respect to the robots 304$a$, 304$b$ and the grids 1230, 1240 and global grid 1250 of FIG. 22.

Figure 23:
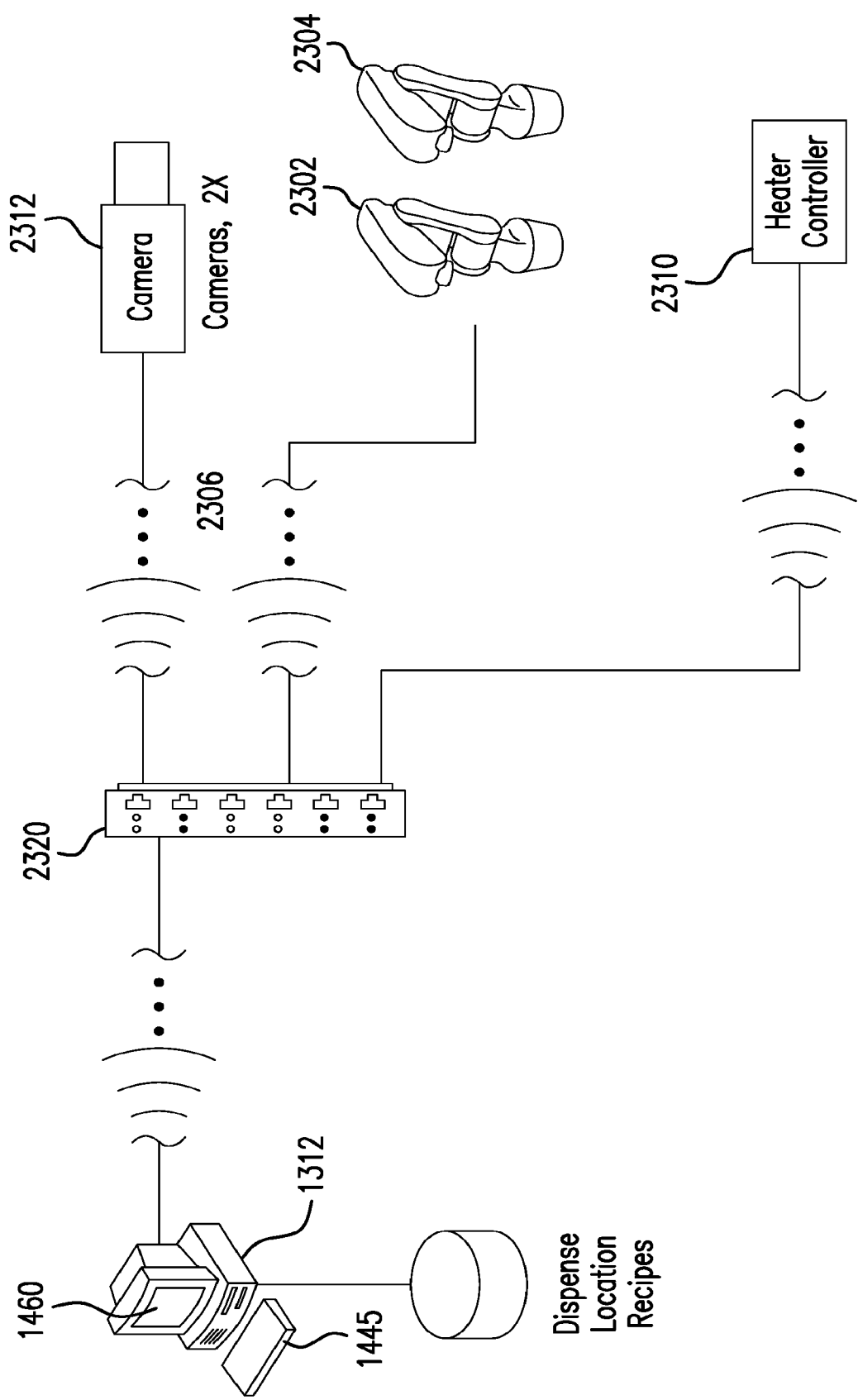
FIG. 23 illustrates a communicative underfill system.

By way of non-limiting example, FIG. 23 illustrates a series of communicative connections for a training or operational chamber system overseen by processing system. As shown, two robots 2302, 2304 may each be communicatively linked 2306, such as via the processing system 1312 associated with the operator display and control console 1445, 1460 discussed throughout, to recipes 2306 suitable for operation of the robots 2302, 2304 upon execution by the processing system 1312. The recipes also ultimately control the heating systems 2310 and other aspects, such as the machine vision 2312, that may allow for control of the execution of the recipes. By way of example, programming logic controller 2320 or a similar switching system may distribute the commands to the foregoing heater(s) 2310, robots 2302, 2304, and/or machine vision 2312.

Figure 24:
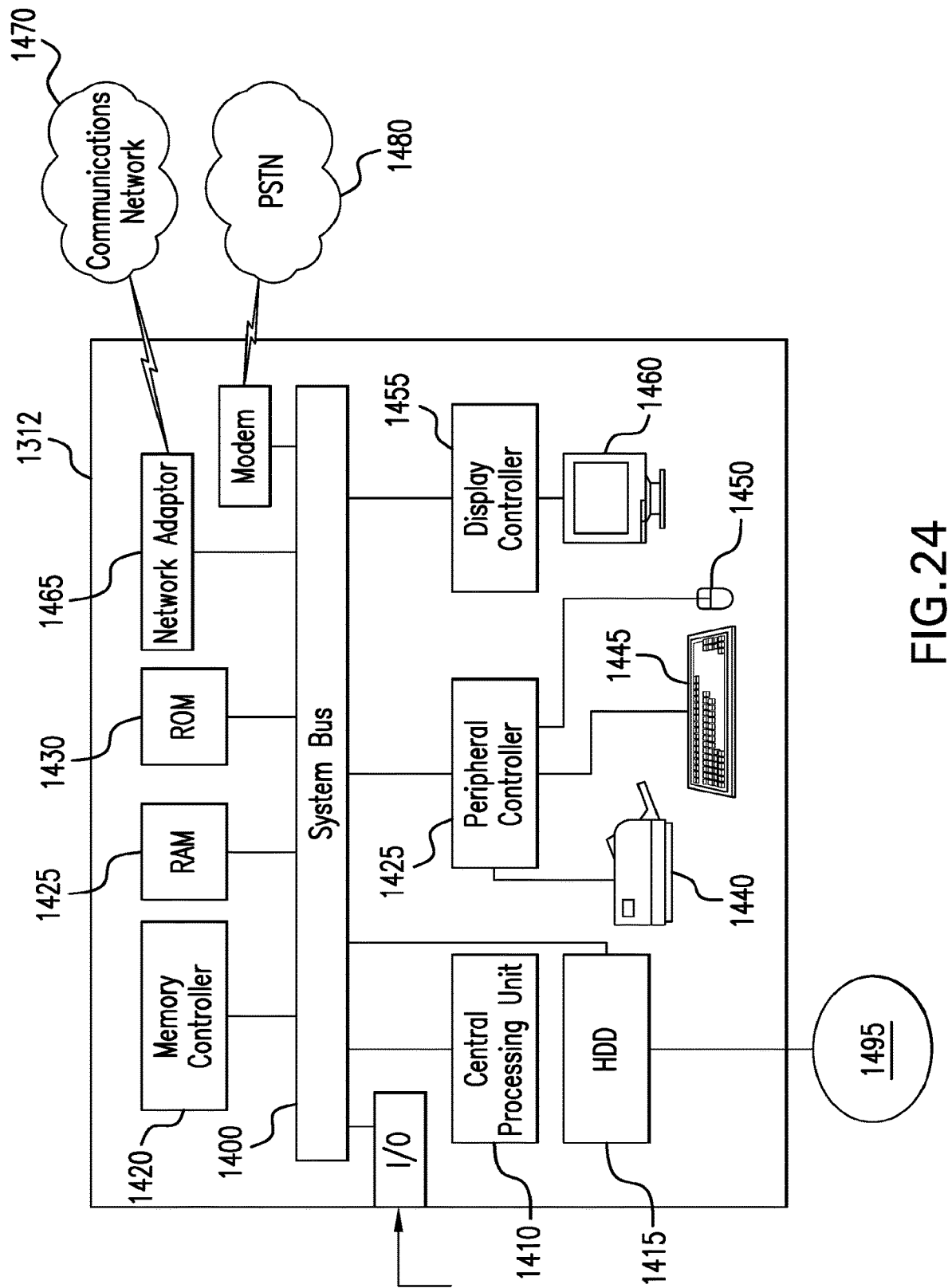
FIG. 24 illustrates an underfill processing system.

FIG. 24 depicts an exemplary computer processing system 1312 for use in association with the embodiments, by way of non-limiting example. Processing system 1312 is capable of executing software, such as an operating system (OS), training applications, user interface, and/or one or more other computing algorithms/applications 1490, such as the recipes discussed herein. The operation of exemplary processing system 1312 is controlled primarily by these computer readable instructions/code 1490, such as instructions stored in a computer readable storage medium, such as hard disk drive (HDD) 1415, optical disk (not shown) such as a CD or DVD, solid state drive (not shown) such as a USB "thumb drive," or the like. Such instructions may be executed within central processing unit (CPU) 1410 to cause system 1312 to perform the disclosed operations, comparisons and calculations. In many known computer servers, workstations, personal computers, and the like, CPU 1410 is implemented in an integrated circuit called a processor.

It is appreciated that, although exemplary processing system 1312 is shown to comprise a single CPU 1410, such description is merely illustrative, as processing system 1312 may comprise a plurality of CPUs 1410. Additionally, system 1312 may exploit the resources of remote CPUs (not shown) through communications network 1470 or some other data communications means 1480, as discussed throughout.

In operation, CPU 1410 fetches, decodes, and executes instructions from a computer readable storage medium, such as HDD 1415. Such instructions may be included in software 1490. Information, such as computer instructions and other computer readable data, is transferred between components of system 1312 via the system's main data-transfer path. The main data-transfer path may use a system bus architecture 1405, although other computer architectures (not shown) can be used.

Memory devices coupled to system bus 1405 may include random access memory (RAM) 1425 and/or read only memory (ROM) 1430, by way of example. Such memories include circuitry that allows information to be stored and retrieved. ROMs 1430 generally contain stored data that cannot be modified. Data stored in RAM 1425 can be read or changed by CPU 1410 or other hardware devices. Access to RAM 1425 and/or ROM 1430 may be controlled by memory controller 1420.

In addition, processing system 1312 may contain peripheral communications controller and bus 1435, which is responsible for communicating instructions from CPU 1410 to, and/or receiving data from, peripherals, such as peripherals 1440, 1445, and 1450, which may include printers, keyboards, and/or the operator interaction elements discussed herein throughout. An example of a peripheral bus is the Peripheral Component Interconnect (PCI) bus that is well known in the pertinent art.

Operator display 1460, which is controlled by display controller 1455, may be used to display visual output and/or presentation data generated by or at the request of processing system 1312, such as responsive to operation of the aforementioned computing programs/applications 1490. Such visual output may include text, graphics, animated graphics, and/or video, for example. Display 1460 may be implemented with a CRT-based video display, an LCD or LED-based display, a gas plasma-based flat-panel display, a touch-panel display, or the like. Display controller 1455 includes electronic components required to generate a video signal that is sent to display 1460.

Further, processing system 1312 may contain network adapter 1465 which may be used to couple to external communication network 1470, which may include or provide access to the Internet, an intranet, an extranet, or the like. Communications network 1470 may provide access for processing system 1312 with means of communicating and transferring software and information electronically. Additionally, communications network 1470 may provide for distributed processing, which involves several computers and the sharing of workloads or cooperative efforts in performing a task, as discussed above. Network adaptor 1465 may communicate to and from network 1470 using any available wired or wireless technologies. Such technologies may include, by way of non-limiting example, cellular, Wi-Fi, Bluetooth, infrared, or the like.

In the foregoing Detailed Description, it can be seen that various features are grouped together in a single embodiment for the purpose of clarity and brevity of the disclosure. This method of disclosure is not to be interpreted as reflecting an intention that the embodiments require more features than are expressly recited herein. Rather, the disclosure is to encompass all variations and modifications to the disclosed embodiments that would be understood to the skilled artisan in light of the disclosure.

What is claimed is:

1. A carrier capable of supporting a printed circuit board during at least an underfill process, comprising:
    an outer frame having, at least about a center point thereof, at least one open aspect;
    at least one frame inset suitable to be removably placed within the at least one open aspect, and capable of supporting at least a first type of the printed circuit board,
    wherein the at least one frame inset comprises at least one heater and at least one air circulator for distributing heat from the at least one heater onto a bottom of the printed circuit board.

2. The carrier of claim 1, wherein the at least one frame inset includes a plurality of clips suitable to maintain a position of the printed circuit board.

3. The carrier of claim 2, wherein at least ones of the plurality of clips rotate over and away from the printed circuit board.

4. The carrier of claim 1, wherein the at least one frame inset comprises at least two handles suitable to provide for manual removal of the printed circuit board.

5. The carrier of claim 4, wherein a first portion of the handles is within the at least one frame inset, and a second portion of the handles is within the outer frame adjacent to the first portion of the handles.

6. The carrier of claim 4, wherein the handles include a slidably opening portion, and wherein the slidable opening is suitable to receive human fingers therethrough.

7. The carrier of claim 4, wherein the handles are spring-actuated.

8. The carrier of claim 4, wherein the handles are spring-closing.

9. The carrier of claim 1, wherein the outer frame comprises at least one other heater that operates in conjunction with the at least one heater.

10. The carrier of claim 1, wherein the frame inset further comprises an air circulation path substantially mated to a path for the distributing of the heat by the at least one air circulator.

11. The carrier of claim 10, wherein the distributing of the heat is substantially even from an outer perimeter of the printed circuit board towards a center point of the printed circuit board.

12. The carrier of claim 11, wherein the distributing of the heat is downward and away from the center point of the printed circuit board.

13. The carrier of claim 9, wherein at least one of the at least one heater and the at least one other heater comprises a finned heater.

14. The carrier of claim 1, wherein the first type is one of specialized, proprietary, and generic.

15. The carrier of claim 1, wherein the first type varies in shape from a second type.

16. The carrier of claim 1, wherein the shape of the first type is one of round, diamond and square.

17. The carrier of claim 1, wherein a size of the first type is one of 32 inches, 38 inches, 42 inches, and 48 inches in diameter.

* * * * *